(12) United States Patent
Masui et al.

(10) Patent No.: US 6,983,005 B2
(45) Date of Patent: Jan. 3, 2006

(54) HOLOGRAPHIC LASER AND OPTICAL PICKUP

(75) Inventors: Katsushige Masui, Nara (JP); Kazuhiro Tsuchida, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 372 days.

(21) Appl. No.: 10/056,255

(22) Filed: Jan. 24, 2002

(65) Prior Publication Data

US 2002/0097773 A1 Jul. 25, 2002

(30) Foreign Application Priority Data

Jan. 24, 2001 (JP) .................................. P2001-016289
Dec. 26, 2001 (JP) .................................. P2001-394848

(51) Int. Cl.
H01S 3/00 (2006.01)
H01S 3/30 (2006.01)
G11B 7/135 (2006.01)

(52) U.S. Cl. ........................ 372/109; 372/705; 372/8; 369/112.04

(58) Field of Classification Search .............. 372/109, 372/705, 8–9, 15, 29, 38; 369/112, 112.04, 369/721, 112.26, 112.08, 112.15, 112.19
See application file for complete search history.

(56) References Cited

U.S. PATENT DOCUMENTS

| | | | | |
|---|---|---|---|---|
| 5,661,711 | A | * | 8/1997 | Tanaka et al. ............ 369/53.2 |
| 5,949,558 | A | * | 9/1999 | Psaltis et al. ................ 359/22 |
| 5,978,112 | A | * | 11/1999 | Psaltis et al. ................ 359/22 |
| 6,456,635 | B1 | * | 9/2002 | Shiomoto et al. ............ 372/36 |
| 6,545,958 | B1 | * | 4/2003 | Hirai et al. .............. 369/44.32 |
| 6,587,481 | B1 | * | 7/2003 | Seong et al. .................... 372/9 |
| 6,643,303 | B2 | * | 11/2003 | Ito et al. .................. 372/38.02 |
| 6,654,393 | B2 | * | 11/2003 | Hamasaki et al. ...... 3372/29.02 |
| 6,785,203 | B2 | * | 8/2004 | Maruyama et al. ...... 369/44.23 |
| 2002/0024916 | A1 | * | 2/2002 | Ueyama et al. ......... 369/112.04 |
| 2003/0174631 | A1 | * | 9/2003 | Nishiyama et al. ..... 369/112.06 |

FOREIGN PATENT DOCUMENTS

| | | |
|---|---|---|
| EP | 1 047 051 | 10/2000 |
| JP | 10-289468 | 10/1998 |
| JP | 11-14828 | 1/1999 |
| JP | 11-149652 | 6/1999 |
| JP | 2000-076689 | * 3/2000 |
| JP | 2000-353332 | 12/2000 |
| JP | 2001-28140 | 1/2001 |
| JP | 2001-68779 | 3/2001 |
| JP | 2001-68794 | 3/2001 |
| JP | 2001-102676 | 4/2001 |
| JP | 2001-217500 | 8/2001 |
| JP | 2001-291260 | 10/2001 |
| JP | 2002-092933 | 3/2002 |

OTHER PUBLICATIONS

U.S. Appl. No. 09/907,880, filed Jul. 12, 2001, T. Ueyama et al.

* cited by examiner

*Primary Examiner*—Don Wong
*Assistant Examiner*—Hung Tran Vy
(74) *Attorney, Agent, or Firm*—David G. Conlin; Steven M. Jensen; Edwards & Angell, LLP

(57) ABSTRACT

It is an object of the invention to provide a holographic laser and an optical pickup, with which it is possible to read from and write to a plurality of types of optical disks with different read wavelengths, and to achieve a more compact apparatus. The holographic laser includes for example a package, two semiconductor laser elements and a photodiode for reading out signals accommodated within the package, a holographic element positioned proximate to or in close contact with the top of a glass window, and a wavelength separating element positioned proximate to or in close contact with the top of the holographic element. The holographic laser is integrally formed as a single component.

21 Claims, 13 Drawing Sheets

HOLOGRAPHIC LASER AND OPTICAL PICKUP

BACKGROUND OF THE INVENTION

1. Field of the Invention

The present invention relates to a holographic laser and an optical pickup for use as the light source for reading out signals from optical disks such as compact disks (CDs), compact disks recordable (CD-Rs), digital versatile disks (DVDs), and digital versatile disks recordable (DVD-Rs), and which are compatible with a plurality of read out wavelengths.

2. Description of the Related Art

In the CD family of optical disks, signals are read or written using a semiconductor laser element having an emission wavelength of 780 nm. On the other hand, in the DVD family of optical disks, to improve the signal recording density, the signals are read or written using a semiconductor laser element having an emission wavelength of 630 to 690 nm.

When optical disks of the CD family and the DVD family are read out or written onto using the same optical disk apparatus, a plurality of semiconductor laser elements with different emission wavelengths are provided within that optical disk apparatus.

FIG. 13 is a structural diagram showing an example of a conventional optical pickup. This optical pickup includes in a single package for example a semiconductor laser 1, which emits light of two different wavelengths, an optical system for guiding read light from the semiconductor laser 1 to an optical disk M, and guiding light reflected from the optical disk M to a photodiode 5, and the photodiode 5, which is for receiving the reflected light and reading the signal.

The optical system includes for example a half mirror 10, which reflects read light from the semiconductor laser 1 and transmits light reflected from the optical disk M, a prism 11 for aligning the optical axes of the read lights of the two wavelengths, a collimating lens 12 for converging the read light, a total reflection mirror 13 for bending the optical axes, and an objective lens 14 for focusing read light onto the optical disk M and for converging light that is reflected from the optical disk M.

At the window of the semiconductor laser 1, there is a diffraction grating 2 for transforming one of the read lights of the two wavelengths into three beams.

FIG. 14 is a structural diagram showing another example of a conventional optical pickup. This optical pickup includes for example a holographic laser 3, which emits read light and receives light reflected from an optical disk M, and an optical system, which is for guiding read light from the holographic laser 3 to the optical disk M and guiding light reflected from the optical disk M to the holographic laser 3.

Integrated into the holographic laser 3 for example are a semiconductor laser, which emits read light of a single-wavelength, and a photodiode for reading out signals.

The optical system is made up of the collimating lens 12, the total reflection mirror 13, and the objective lens 14, for example.

With the configuration of FIG. 13, the number of optical components, such as the prism 11 for adjusting the optical axes, increases, because the read lights of two wavelengths are guided to the optical disk M and the light reflected from the optical disk M is returned to the single photodiode 5. As a result, the positions of the optical components have to be adjusted in more instances, which makes the adjustment during assembly complicated. Moreover, the optical pickup becomes larger, which complicates making the optical disk apparatus thinner and lighter.

With the configuration of FIG. 14, the optical pickup is limited to reading out only a single wavelength, and therefore is incapable of reading out different families of optical disks. Two optical pickups, each with the same configuration and which read different wavelengths, must be provided to be compatible with a plurality of read wavelengths.

When semiconductor lasers of two different wavelengths and a photodiode are integrated in the same holographic laser, light emitted from two different positions is returned to the light-receiving surface of the single photodiode, and therefore the dimensional precision and the assembly precision of the optical components must be extremely good.

The emission wavelength of semiconductor laser elements depends, for example, on the temperature and the intensity of the optical output, and therefore it must be taken into account that the plurality of read wavelengths fluctuate independently. The diffraction angle in holograms changes with the wavelength, and if the grating spacing is constant, then the shorter the wavelength, the smaller the angle of diffraction.

If there is only one type of optical disk to read and only a single semiconductor laser element, then the line at which the photodiode separates received light can be positioned in the direction in which the angle of diffraction of the hologram changes due to fluctuations in the wavelength, thus making it possible to obviate the effect of wavelength fluctuations.

However, when the optical disk apparatus is compatible with a plurality of optical disk types of different read wavelengths, then the fact that there are two semiconductor laser elements means that the two reflected laser lights are not necessarily both incident on the line at which the received light is separated, even if the line at which the photodiode separates received light is positioned in the direction that the angle of diffraction of the holograms changes due to fluctuations in the wavelength.

When semiconductor laser elements of two wavelengths having two light-emission points are used in the same chip, the emission points are close to each other, and therefore it is difficult to receive the light with the same light receiving element. This is because holographic elements have the characteristic that the angle of diffraction is determined by the wavelength when the same diffraction grating is used, and thus when the emission points are close to each other it is difficult to focus light with different angles of diffraction onto the same point. For example, when the distance between the laser light-emission point and the diffraction grating is approximately 2 to 3 mm and the distance between the diffraction grating and the light receiving surface of the light receiving element is approximately 1 mm, then, if the size of the laser light-emission point is approximately 150 to 250 $\mu$m, the light beams can be converged onto the same point, but when the size of the laser light-emission point is between several $\mu$m to several dozen $\mu$m, the diameter of the spot on the light receiving surface in turn becomes approximately 150 to 250 $\mu$m, and therefore the light cannot be focused onto the same light receiving element.

Furthermore, when the laser light-emission point is placed away from the optical axis of the optical system, aberrations occur each time light passes through a lens, thus negatively affecting optical pickup properties.

SUMMARY OF THE INVENTION

It is an object of present the invention to provide a holographic laser and an optical pickup, with which it is possible to reading from or writing onto a plurality of types of optical disks having different read wavelengths, and to achieve a more compact apparatus.

The invention provides a holographic laser including:

a first light source for emitting a light beam L1 of a first wavelength toward an optical disk;

a second light source for emitting a light beam L2 of a second wavelength different from the first wavelength toward an optical disk;

a wavelength separating element for separating the light beam L1 and the light beam L2 reflected by the respective optical disks;

a first holographic element for converging the light beam L1 separated by the wavelength separating element;

a second holographic element for converging the light beam L2 separated by the wavelength separating element; and a light receiving element for receiving the light beam L1 converged by the first holographic element and the light beam L2 converged by the second holographic element, wherein the light receiving element is positioned between a focal position of 0th order diffracted light of the first holographic element and a focal position of 0th order diffracted light of the second holographic element; and wherein the first light source, the second light source, the wavelength separating element, the first holographic element, and the second holographic element are integrally formed into a single component.

According to this invention, a light beam L1 of a first wavelength or a light beam L2 of a second wavelength is emitted toward an optical disk and the light beam L1 or L2 reflected by the optical disk is detected by a common light receiving element, and therefore it is possible to read from or write to a plurality of types of optical disks of different read wavelengths. Moreover, because the light receiving element is shared, the number of components is reduced and the optical pickup can be made compact.

Furthermore, by positioning the light receiving element between the focal positions of the 0th order diffracted lights it is possible to arrange the light receiving element compactly and make the optical pickup smaller.

Moreover, integrally forming the first light source, the second light source, the wavelength separating element, the first holographic element, and the second holographic element into a single component makes handling of the components easy and makes it possible to reduce the number of process steps and costs for assembling and adjusting the position of the optical pickup.

In the invention it is preferable that directions of diffraction of the first holographic element and the second holographic element are substantially parallel to an alignment direction of the first holographic element and the second holographic element.

According to this invention, by setting the directions of diffraction and the alignment direction of the first holographic element and the second holographic element substantially parallel, it is possible to make the space for arranging components thinner.

In the invention it is preferable that an alignment direction of the first light source and the second light source is substantially parallel to an alignment direction of the first holographic element and the second holographic element.

According to this invention, by setting the alignment direction of the first light source and the second light source substantially parallel to the alignment direction of the first holographic element and the second holographic element, it is possible to make the space for arranging components thinner.

In the invention it is preferable that the first holographic element and the second holographic element have a substantially equal grating pitch.

According to this invention, by making the grating pitches of the first holographic element and the second holographic element substantially equal to one another, the diffraction efficiency of the holographic elements is matching, so that the read operation using the light beam L1 or the light beam L2 is stabilized, and moreover manufacture of the holographic elements is simplified, and thus manufacturing costs can be reduced.

In the invention it is preferable that the first holographic element and the second holographic element have a plurality of small gratings which are divided into a plurality of regions, and grating pitches of the small gratings on the same holographic element are substantially equal.

According to this invention, by making the grating pitches of the small gratings on the same holographic element substantially equal, the diffraction efficiency of the small gratings is matching, so that the read operation is stabilized, and moreover the manufacture of the holographic elements is simplified, and thus manufacturing costs can be reduced.

In the invention it is preferable that the light receiving element is positioned so as to be closer to the focal position of 0th order diffracted light from the holographic element which converges light of the shorter wavelength of the light beam L1 and the light beam L2 than to the focal position of 0th order diffracted light from the holographic element which converges light of the longer wavelength of the light beam L1 and the light beam L2.

According to this invention, positioning the light receiving element closer to the focal position of the 0th order diffracted light of the holographic element for the shorter wavelength makes it possible to give the holographic elements a uniform grating pitch, so less precision is required when fabricating the holographic elements.

In the invention it is preferable that the light receiving element has a plurality of light receiving regions for receiving light diffracted by the small gratings of the first holographic element and the second holographic element, a first light receiving region of the light receiving regions detects diffracted light including RF signals of a compact disk and diffracted light including RF signals of a digital versatile disk, and a second light receiving region of the light receiving regions detects diffracted light including RF signals of a compact disk and diffracted light including phase difference signals of a digital versatile disk.

According to this invention, common light receiving regions are provided for detecting RF signals and phase difference signals, which include high frequency components, making it possible to reduce the number of high-speed light receiving regions and to simplify the light receiving element.

In the invention it is preferable that a shape of the second light receiving region is that of two intersecting parallelograms extending along directions of diffraction of the holographic elements, wherein one of four corners of one of the parallelograms exists within the other parallelogram.

According to this invention, two diffracted light beams are received while reducing the light receiving area to a minimum, so a faster responding light receiving region can be achieved. Moreover, by forming the light receiving region in a shape in which one of the four corners of one parallelogram is included within the other parallelogram, it is possible to reduce the peripheral length of the light receiving region to a minimum, so that a faster responding light receiving region can be achieved.

In the invention it is preferable that the plurality of light receiving regions are aligned perpendicular to an alignment direction of the first holographic element and the second holographic element.

According to this invention, when the light beam L2 reflected by the optical disk is incident on the first holographic element, its focal point is shifted away from the proper light receiving region, and also when the light beam L1 reflected by the optical disk is incident on the second holographic element, its focal point is shifted away from the proper light receiving region. Consequently, undesired light due to defective separation can be prevented from being projected onto the proper light receiving region.

The present invention provides a holographic laser including:

a first light source for emitting a light beam L1 of a first wavelength toward an optical disk;

a second light source for emitting a light beam L2 of a second wavelength different from the first wavelength toward an optical disk;

a wavelength separating element for separating the light beam L1 and the light beam L2 reflected by the respective optical disks;

a first holographic element for converging the light beam L1 separated by the wavelength separating element;

a second holographic element for converging the light beam L2 separated by the wavelength separating element; and a light receiving element for receiving the light beam L1 converged by the first holographic element and the light beam L2 converged by the second holographic element, wherein the second holographic element, the first holographic element, and the wavelength separating element are arranged in this order in a direction in which the light beam L1 and the light beam L2 are emitted from the first and second light sources toward the respective optical disks, wherein the light receiving element is arranged so as to be located between a couple of the focal positions of the 0th order diffracted light of the first and second holographic elements and a couple of the first and second light sources on a virtual plane perpendicular to an optical axis of the light beam L1 or light beam L2 emitted toward the optical disk from the first or second light source onto which plane the light receiving element is projected, and wherein the first light source, the second light source, the wavelength separating element, the first holographic element, and the second holographic element are formed integrally into a single component.

According to this invention, since the light receiving element and the wavelength separating element are shared by both the light beam L1 and the light beam L2, it is possible to reduce the number of components and to make the optical pickup smaller. Moreover, the first and second holographic elements are provided for the light beam L1 and the light beam L2, respectively, and the first holographic element and the second holographic element are disposed stacked on one another and are able to separately adjust the optical axes and/or paths of the light beam L1 and the light beam L2, which have different wavelengths. This contributes to increasing production efficiency of the apparatus without necessitating highly precise assembly.

The invention provides a holographic laser comprising:

a first light source for emitting a light beam L1 of a first wavelength toward an optical disk;

a second light source for emitting a light beam L2 of a second wavelength different from the first wavelength toward an optical disk;

first and second wavelength separating elements for respectively separating the light beam L1 and the light beam L2 reflected by the respective optical disks;

a first holographic element for converging the light beam L1 separated by the first wavelength separating element;

a second holographic element for converging the light beam L2 separated by the second wavelength separating element; and a light receiving element for receiving the light beam L1 converged by the first holographic element and the light beam L2 converged by the second holographic element;

wherein the first holographic element, the first wavelength separating element, the second holographic element, and the second wavelength separating element are arranged in this order in a direction in which the light beam L1 and the light beam L2 are emitted from the first and second light sources toward the respective optical disks;

wherein the light receiving element is positioned between a focal position of 0th order diffracted light of the first holographic element and a focal position of 0th order diffracted light of the second holographic element; and wherein the first light source, the second light source, the first wavelength separating element, the second wavelength separating element, the first holographic element, and the second holographic element are formed integrally into a single component.

According to this invention, the first and second holographic elements, and the first and second wavelength separating elements are provided for the light beam L1 and the light beam L2, respectively, and the first holographic element, the first wavelength separating element, the second holographic element, and the second wavelength separating element are disposed stacked on one another in this order and are capable of separately adjusting the optical axes and/or paths of the light beam L1 and the light beam L2, which have different wavelengths. This contributes to increasing production efficiency of the apparatus without necessitating highly precise assembly.

In the invention it is preferable that holograms formed in the first and second holographic elements are positioned away from light paths formed by the light beam L1 and the light beam L2 from the first and second light sources to the optical disk.

According to this invention, the light beam L1 and the light beam L2 do not pass through the holograms between emission from the first and second light sources and arrival at the optical disk. Thus, there is no quantitative loss in the light beams L1 and L2 due to diffraction, and therefore it is possible to write and read information to and from an optical disk at a high light intensity.

It is preferable that the light beam L1 and the light beam L2 have different wavelengths, and the wavelength separating element separates the wavelengths of both the light beam L1 and the light beam L2.

According to this invention, the light beams L1 and L2, which are of different wavelengths, are wavelength-separated by a single common wavelength separating element, so the space for positioning components can be made thinner.

In the invention it is preferable that the light beam L1 and the light beam L2 have different wavelengths, and the first wavelength separating element separates only the light beam L1 wavelength, and the second wavelength separating element separates only the light beam L2 wavelength.

According to this invention, the light beams L1 and L2, which are of different wavelengths, are wavelength-separated by the first wavelength separating element and the second wavelength separating element, respectively, so light of these wavelengths can be adjusted separately, and assembly into the apparatus is facilitated.

In the invention it is preferable that the hologram formed in the first holographic element and the hologram formed in the second holographic element are positioned such that plus first-order diffracted light (hereinafter, referred to as "+1st order diffracted light") of the light beam L1 diffracted by the hologram formed in the first holographic element does not pass through the hologram formed in the second holographic element.

According to this invention, the positions of the hologram formed in the first holographic element and the hologram formed in the second holographic element are determined such that +1st order diffracted light of the light beam L1 which is diffracted by the hologram formed in the first holographic element does not pass through the hologram formed in the second holographic element, and therefore the harmful effect that +1st order diffracted light has on the detection of read signals from the information recording surface of an optical disk light by the receiving element can be avoided.

In the invention it is preferable that the hologram formed in the first holographic element and the hologram formed in the second holographic element are positioned such that all of the light beam L2 passes through the hologram formed in the first holographic element and is incident on the hologram formed in the second holographic element.

According to this invention, all of the light beam L2 passes through the hologram formed in the first holographic element and is incident on the hologram formed in the second holographic element, so that light of different quantities, such as light that passes through the hologram formed in the first holographic element and light that does not, is not incident on the hologram formed in the second holographic element. Consequently, non-uniformities in the light intensity distribution of the diffracted light of the light beam L2 are not created by the hologram formed in the second holographic element, and the light receiving element has improved detection precision in reading out signals from the information recording surface of the optical disk.

In the invention it is preferable that a hologram formed in the first holographic element and a hologram formed in the second holographic element are positioned such that all of the light beam L2 that passes through the hologram formed in the first holographic element also passes through the hologram formed in the second holographic element; and the hologram formed in the second holographic element and the light receiving element are positioned such that neither +1st nor −1st order diffracted light that is diffracted by the hologram formed in the second holographic element is incident on the light receiving element.

According to this invention, all of the light beam L2 that passes through the hologram formed in the first holographic element also passes through the hologram formed in the second holographic element, and the hologram formed in the first holographic element, the hologram formed in the second holographic element, and the light receiving element are positioned such that neither positive or negative first-order diffracted light (hereinafter, referred to as "±1st order diffracted light") of the light beam L2 that is diffracted by the hologram formed in the second holographic element are incident on the light receiving element. Therefore, the harmful effect that ±1st order diffracted light has on the light receiving element in detecting read signals from the information recording surface of an optical disk is avoided, and the precision of detecting the read out signals can be improved.

The invention provides an optical laser pickup including:
the above-described holographic laser; and
an optical system for guiding light emitted from the holographic laser to an optical disk and guiding light reflected from the optical disk to the holographic laser.

According to this invention, with a single optical pickup, it is possible to read from or write to a plurality of types of optical disks having different read wavelengths, and moreover the apparatus can be made compact and manufacturing costs can be reduced.

According to the invention, it is possible to use the light beam L1 of a first wavelength or the light beam L2 of a second wavelength to read or write to a plurality of types of optical disks having different read wavelengths.

By sharing components and arranging them in a certain manner, it is possible to achieve a reduction in the number of components, a more compact and thinner optical pickup, and a reduction in manufacturing costs.

By arranging and shaping the light receiving regions of the light receiving element in a certain manner, it is possible to achieve a simpler light receiving element and higher response speeds.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
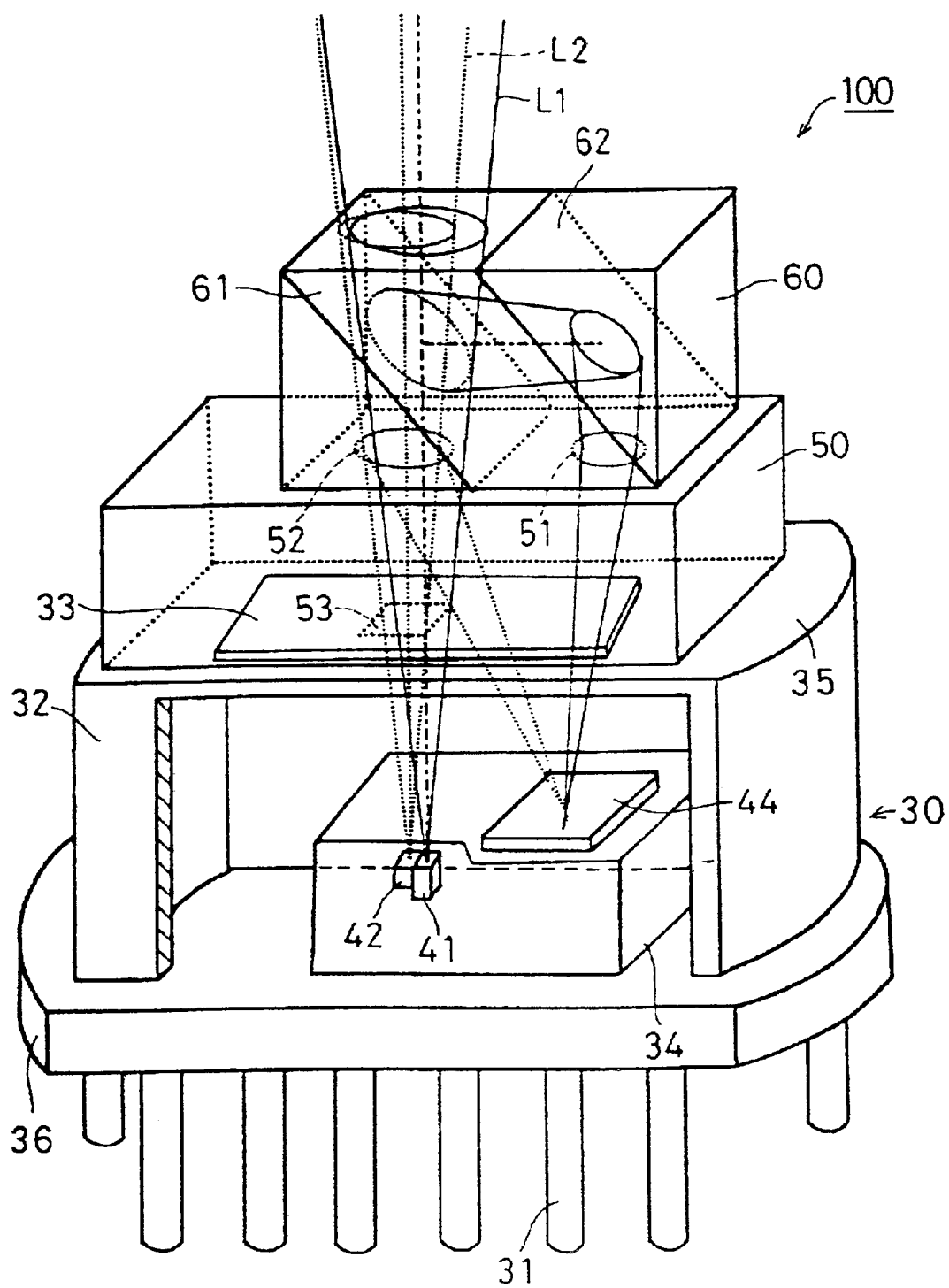
FIG. 1 is a partially transparent perspective view schematically showing the configuration of a holographic laser 100 according an embodiment of to the invention.

Now referring to the drawings, preferred embodiments of the invention are described below.

Figure 2:
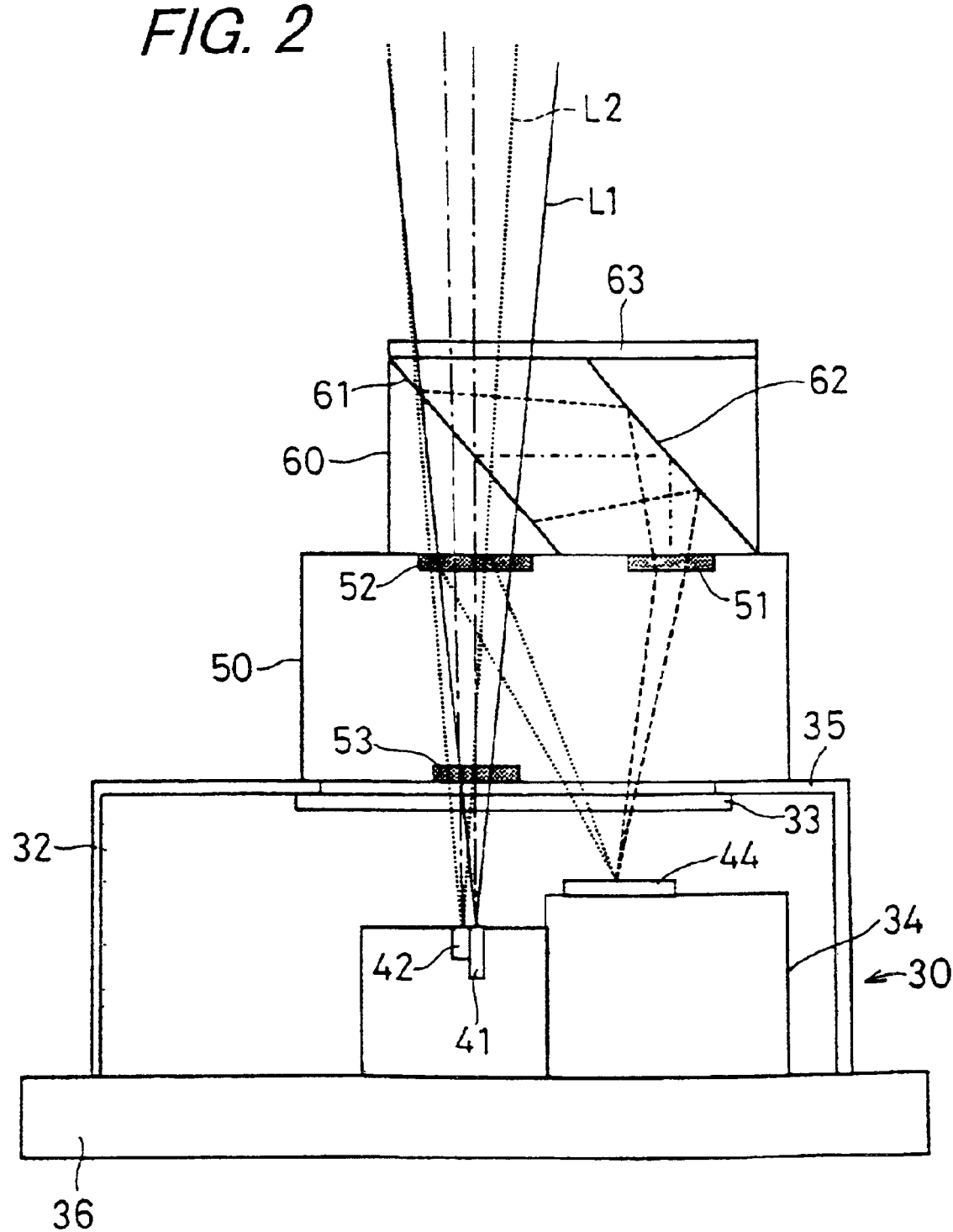
FIG. 2 is a cross-sectional view showing the internal configuration of the holographic laser 100 shown in FIG. 1.

FIG. 1 is a partially transparent perspective view schematically showing the configuration of a holographic laser 100 according to an embodiment of the invention. FIG. 2 is a cross-sectional view showing the internal configuration of the holographic laser 100 shown in FIG. 1.

The holographic laser 100 includes a package 30 having a glass window 33 in a top plate 35; two semiconductor laser elements 41 and 42, and a photodiode 44 for detecting signals, accommodated inside the package 30; a holographic element 50, disposed proximate to or in close contact with the top of the glass window 33; and a wavelength separating element 60 disposed proximate to or in close contact with the top of the holographic element 50. The holographic laser 100 is formed integrally as a single component.

The package 30 has for example an oval internal holding space and has a plurality of connection terminals 31 extending from the outside surface of a bottom plate 36; a cap 32 blocking the internal holding space from the outside; the glass window 33 fastened to the opening of the top plate 35 of the cap 32; and a heat sink 34 provided on the inside surface of the bottom plate 36. The semiconductor laser elements 41 and 42 and the photodiode 44 are mounted on the heat sink 34.

The semiconductor laser element 41 emits a light beam L1 that is a red laser light beam having an emission wavelength of for example 650 nm and is used as the read light for DVDs. The semiconductor laser element 42 is disposed near the semiconductor laser element 41 and emits a light beam L2 that is an infrared laser light beam having an emission wavelength of for example 780 nm and used as the read light for CDs.

The holographic element 50 is a rectangular solid made of a transparent material, and a diffraction grating 53 is formed at its bottom surface on the side of the glass window 33. The diffraction grating 53 is for diffracting the laser light to generate three beams of light, which are used for detecting the tracking signals of the optical disk. The diffraction grating 53 has diffraction properties that are optimized, for example, for the read-out wavelength of 780 nm of CDs.

A hologram 51 and a hologram 52 are formed at a predetermined distance from one another at the upper face of the holographic element 50. The hologram 51 is for diffracting light of 650 nm wavelength reflected by the optical disk and converging it onto the light receiving surface of the photodiode 44. The hologram 52 is for diffracting light of 780 nm wavelength reflected by the optical disk and converging it onto the light receiving surface of the photodiode 44.

Thus, by forming the diffraction grating 53 and the holograms 51 and 52 integrally with the holographic element 50, the number of optical components can be reduced.

The photodiode 44 is disposed within the plane (paper plane of FIG. 2) defined by the alignment direction of the two holograms 51 and 52 and the optical axes of the laser light, and is positioned between the holograms 51 and 52 when observed along the optical axes and is disposed between the focal position of the 0th order diffracted light of the hologram 51 and the focal position of the 0th order diffracted light of the hologram 52. This positional relationship makes it possible to guide light of different wavelengths to the same light receiving position.

The holograms 51 and 52 diffract light with the same principle as a diffraction grating, and their diffraction grating pitch is determined by the angle of diffraction. The smaller the diffraction grating pitch, the higher the demand for production precision, so the pitch of the diffraction grating is preferably large.

When the photodiode 44 is not between the holograms 51 and 52, then the angle of diffraction for the hologram farther from the photodiode 44 increases, and as a result the diffraction grating pitch of that hologram must be made small.

In the invention, the photodiode 44 is disposed between the holograms 51 and 52 and receives light that is diffracted by the hologram 51 toward hologram 52 and light that is diffracted by the hologram 52 toward the hologram 51, so that the diffraction grating pitch does not have to be made small, requiring less production precision and also contributing to making the package 30 smaller.

Red laser light from the semiconductor laser element 41, infrared laser light from the semiconductor laser element 42, and light reflected by the optical disk and arriving at the photodiode 44 passes through the glass window 33 of the package 30. To prevent condensation, the void between the holographic element 50 and the glass window 33 is sealed after filling it with dry air, for example, or is ventilated to the outside. It should be noted that it is also possible to fix the holographic element 50 directly to the top plate opening of the cap 32, omitting the glass window 33.

The package 30 is mounted on the optical pickup such that it can be rotatably adjusted around the optical axis of the laser light so as to adjust the tracking position of the three light beams diffracted by the diffraction grating 53. It is also preferable that the package 30 is more oval than circular so as to reduce the thickness of the optical pickup. Thus, it is preferable that the semiconductor lasers 41 and 42, the holograms 51 and 52, and the wavelength separating element 60 are disposed along the longitudinal direction of the oval package.

The wavelength separating element 60 is mounted on the holographic element 50, and includes, for example, a separating filter 61, which is for separating light of 780 nm wavelength and light of 650 nm wavelength reflected from the optical disk, and a reflecting mirror 62, which is for downward reflection of one of the reflected light beams separated by the separating filter 61, for example the reflected light beam of 650 nm wavelength. The separating filter 61 and the reflecting mirror 62 are formed integrally as a single optical component. A cover glass 63 can also be provided when necessary, as illustrated in FIG. 2.

There are two possible configurations for the separating filter 61: a) a polarizing prism configuration, in which light is separated according to differences in polarization direction, and b) a wavelength selecting filter configuration, in which light is separated according to differences in wavelength. When the polarization prism configuration is used, possible characteristics are that reflected light of 780 nm wavelength passes the separating filter 61 in TE mode and reflected light of 650 nm wavelength is reflected in TM mode. When the wave length selecting filter format is used, possible characteristics are that the reflected light of 780 nm wavelength passes the separating filter 61 and the reflected light of 650 nm wavelength is reflected.

Reflected light having a wavelength of 650 nm that has been reflected by the reflecting mirror 62 is diffracted by the hologram 51 and transformed primarily into minus first-order diffracted light (hereinafter written as "−1st order diffracted light"), 0th order diffracted light, and +1st order diffracted light, of which the −1st order diffracted light is incident on the photodiode 44. The 0th order diffracted light and the +1st order diffracted light are not used.

Reflected light having a wavelength of 780 nm that has been passed through the separating filter 61 is diffracted by the hologram 52 and transformed primarily into −1st order diffracted light, 0th order diffracted light, and +1st order diffracted light, of which the +1st order diffracted light is incident on the photodiode 44.

Figure 3:
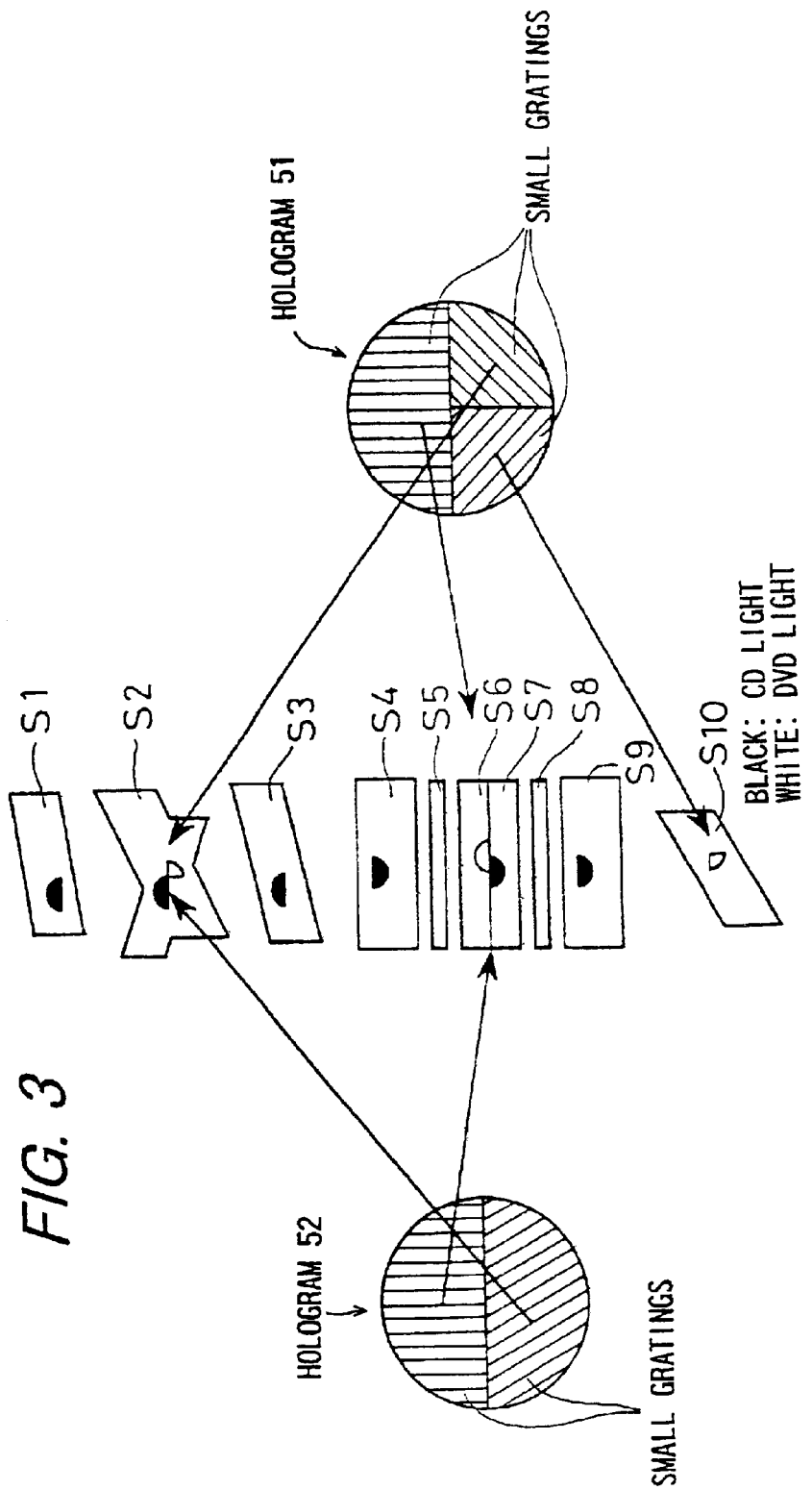
FIG. 3 is a diagram illustrating the optical relationship between the holograms 51 and 52 and the photodiode 44.

FIG. 3 is a diagram illustrating the optical relationship between the holograms 51 and 52 and the photodiode 44. The hologram 51 for DVDs is split three ways into one small grating in the shape of a half-circle and two small gratings in the shape of quarter circles, and the small gratings are set so that they each have a different direction of diffraction (direction perpendicular to the grating grooves). The hologram 52 for CDs is split two ways into two small gratings in the shape of half circles, and the small gratings are set so that they each have a different direction of diffraction (direction perpendicular to the grating grooves).

For the performance of the small gratings, the diffraction efficiencies of the 0th order diffracted light and the ±1st order diffracted light, and the ratio thereof, are essential. The small gratings preferably all have an equal grating pitch, which gives the small gratings matching diffraction efficiency, and in particular makes it possible to make the ratio of those diffraction efficiencies constant. It is preferable that the holograms 51 and 52 are given an equal grating pitch, because then their diffraction efficiency matches one another and manufacturing costs can be reduced.

The alignment direction of the holograms 51 and 52 can be set parallel to the alignment direction of the semiconductor laser elements 41 and 42 to make the package 30 more compact and simple.

The −1st order diffracted light that has been diffracted by the small grating of the hologram 51 and the +1st order diffracted light that has been diffracted by the small grating of the hologram 52 both arrive at the same spot on the photodiode 44. On the other hand, if manufacturing variations in the separating filter 61 result in incomplete separation of the reflected light of 650 nm wavelength and the reflected light of 780 nm wavelength, when a portion of the reflected light of 650 nm wavelength is incident on the hologram 52, or when a portion of the reflected light of 780 nm wavelength is incident on the hologram 51, that light shifts along the direction of diffraction from its original focal position. As a counter measure, the light receiving regions of the photodiode 44 are aligned perpendicular to the alignment direction of the holograms 51 and 52 so as to prevent unwanted light due to inadequate beam-separating from being incident on the proper light receiving region. For example, when the reflected light of 780 nm wavelength is incident on the hologram 51, the angle of diffraction is increased, and the light converged to a focal point shifted away from the proper light receiving region toward the hologram 52. Conversely, when the reflected light of 650 nm wavelength is incident on the hologram 52 the angle of diffraction is decreased, and the light converged to a focal point removed from the proper light receiving region toward the hologram 51.

The photodiode 44 is arranged between the holograms 51 and 52, slightly off center between the two toward the hologram 51. When the grating pitches of the holograms 51 and 52 are all equal, the light with the shorter wavelength has a smaller angle of diffraction, and in this case the angle of diffraction of the 650 nm wavelength light is smaller than that of the light having a wavelength of 780 nm. Consequently, by proportionally dividing the distance between the holograms 51 and 52 with consideration of the difference in the angle of diffraction between the 650 nm and the 780 nm wavelength light, it is possible to determine the spot at which both have the same focal point, and the photodiode 44 can be arranged at that spot.

As shown in FIG. 3, the light receiving regions S1 to S10 of the photodiode 44 have an elongated shape and their longitudinal direction is arranged parallel to the diffraction direction of the small grating to which they correspond. The longitudinal dimensions of the light receiving regions allow for shifts in the focal position resulting from fluctuations in the wavelength of the light source, and are set to a length at which the capacitance of the light receiving surface is not very large. It should be noted that in FIG. 3 the black semicircles are the reflection spots of a CD, and the white semicircles and the white quarter-circles are the reflection spots of a DVD.

The light receiving regions S1 to S10 are selectively used to create focus error signals, RF signals, and tracking error signals during the read out of CDs and DVDs, and receive signal lights having identical roles when reading CDs and DVDs. For example, the light receiving region for obtaining RF signals when reading out a CD, and the light receiving region for obtaining RF signals and phase difference signals when reading out a DVD, require high-speed response properties, and in FIG. 3 the light receiving regions S6 and S7 detect the RF signal of a CD and the RF signal of a DVD, and the light receiving region S2 detects the RF signal of a CD and one of either the RF signal or the phase difference signal of a DVD. The other of the RF signal or phase difference signal of a DVD is detected by the light receiving region S10.

The light receiving regions S1, S3, S4, and S9 are for detecting the tracking error signals of CDs, and do not require especially high response speeds. The light receiving regions S5 and S8 are for canceling out stray light into the FES signal due to the two-layered nature of DVDs, and no light is incident on them during signal reproduction, so that they do not require high response speeds.

The light receiving region S2 is for detecting light diffracted from the small gratings of the holograms 51 and 52, and because the central axes of the diffracted light beams are different, the light receiving region S2 has the shape of two intersecting parallelograms. To raise the response speed of the light receiving region S2, the light receiving area and the length of the perimeter of the light receiving region are preferably made as small as possible. To reduce the light receiving area, the light receiving region S2 has a shape in which the two parallelogram-shaped light receiving regions are directly stacked on one another. To reduce the length of the perimeter, the light receiving region S2 has a shape in which one of the four corners of one parallelogram is included within the other parallelogram.

Figure 4:
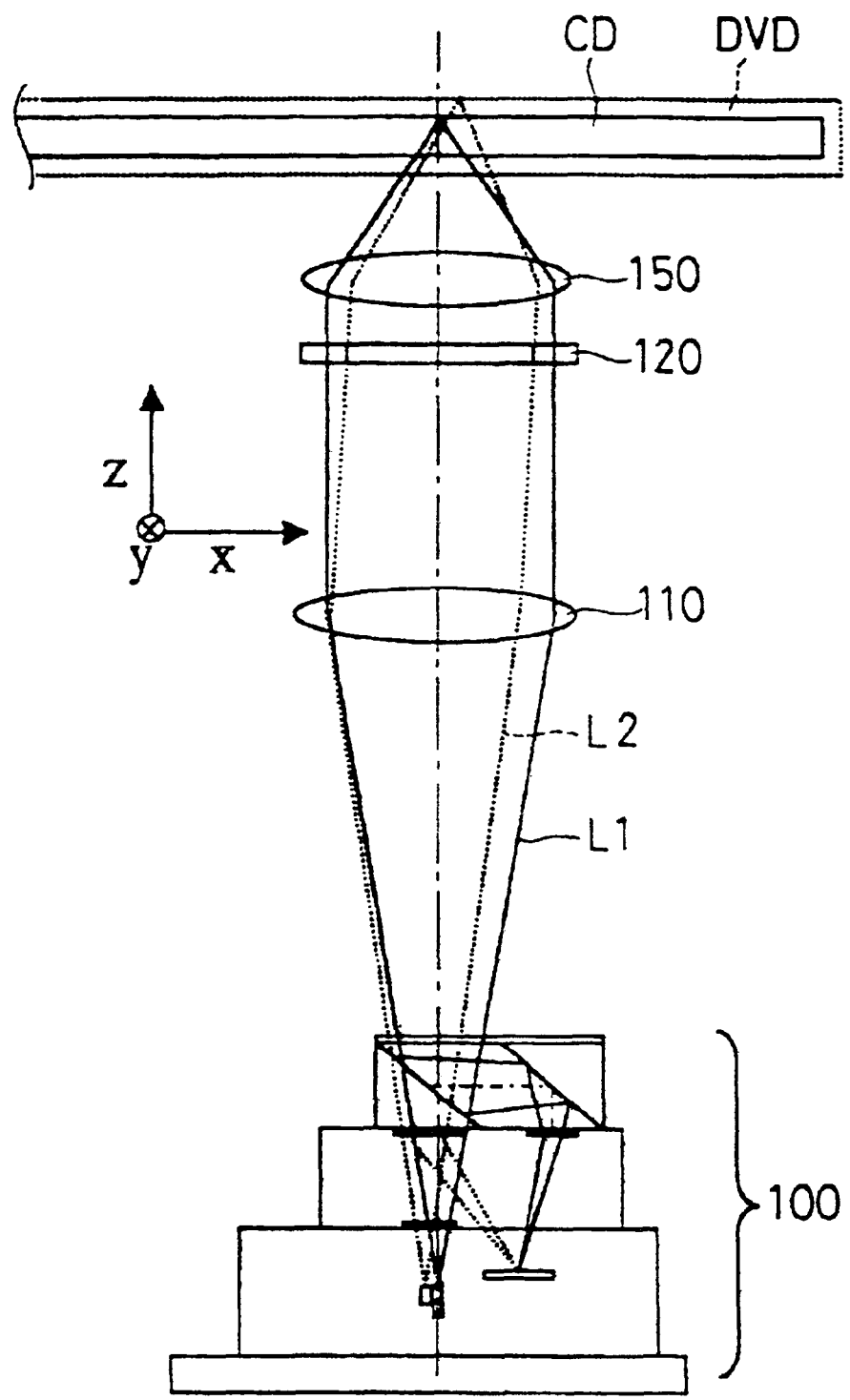
FIG. 4 is a structural diagram showing an embodiment of the optical pickup according to the invention.

FIG. 4 is a structural diagram showing an embodiment of the optical pickup according to the invention. The optical pickup includes, for example, the above-described holographic laser 100 and an optical system for guiding read light from the holographic laser 100 to an optical disk such as a CD or DVD and guiding light reflected from the optical disk to the holographic laser 100.

The optical system is made up of a collimating lens 110, a wavelength selecting aperture 120, and an objective lens 150, for example. The collimating lens 110 turns CD read light and DVD read light from the holographic laser 100 into substantially parallel light, and converges CD reflected light and DVD reflected light from the optical disk toward the holographic laser 100.

The wavelength selecting aperture 120 has a region for transmitting light in which the dimensions of the apertures are different depending on the wavelength, and are optimized for the light beam L1, which has a wavelength of 650 nm, and the light beam L2, which has a wavelength of 780 nm, so as to prevent stray light.

The objective lens 150 focuses CD read light and DVD read light onto the recording surface of the optical disk, and converges CD reflected light and DVD reflected light from the optical disk.

Figure 5:
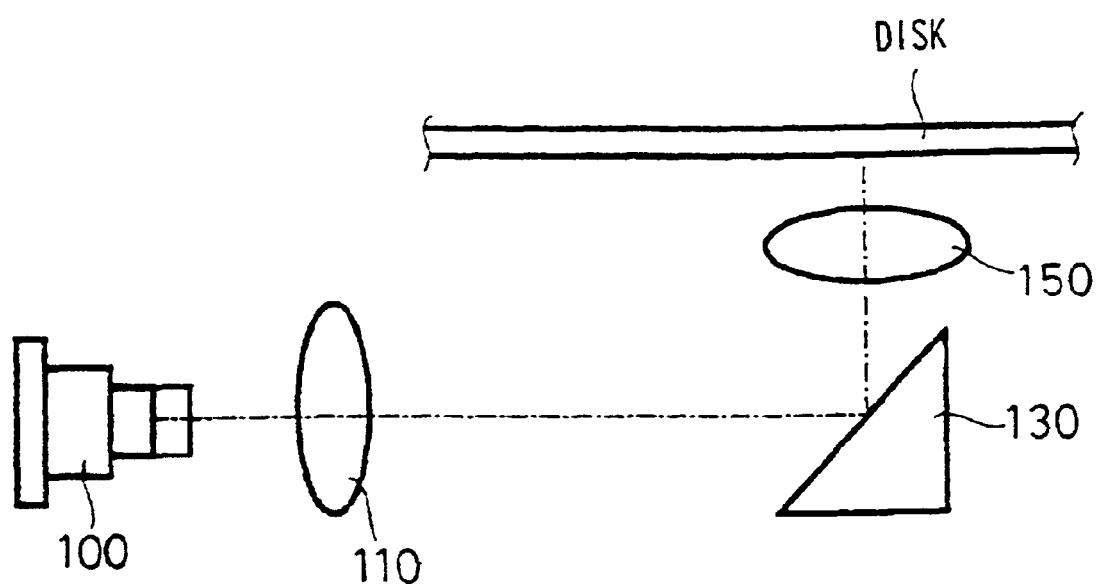
FIG. 5 is a structural diagram showing another embodiment of the optical pickup according to the invention.

FIG. 5 is a structural diagram showing another embodiment of the optical pickup according to the invention. The optical pickup includes, for example, the above holographic laser 100 and an optical system for guiding read light from the holographic laser 100 to an optical disk such as a CD or DVD and guiding light reflected from the optical disk to the holographic laser 100. The optical system is made up of the same collimating lens 110 as in FIG. 4, an upright mirror 130, and the same objective lens 150 as in FIG. 4, for example.

With this configuration, a thinner overall apparatus can be attained by using an oval package for the holographic laser 100, setting the hologram diffraction directions parallel to the arc direction of the oval package, and using the upright mirror 130 to bend the optical axes 90 degrees.

Next the operation for reading out signals from optical disks will be explained. When a DVD is set as the optical disk, the semiconductor laser element 41 is activated and emits 650 nm wavelength light for reading the DVD, which passes through the optical system of the optical pickup and is focused on the recording surface of the DVD. light reflected from the DVD changes in intensity depending on whether or not there are recording pits, and once again passes through the optical system of the optical pickup, enters the wavelength separating element 60 of the hologram laser 100 and is then reflected by the separating filter 61 and the reflecting mirror 62, and finally is diffracted by the hologram 51 and converged onto the light receiving surface of the photodiode 44.

On the other hand, when a CD is set as the optical disk, the semiconductor laser element 42 is activated and emits 780 nm wavelength light for reading the CD, which passes through the optical system of the optical pickup and is focused on the recording surface of the CD. Light reflected from the CD changes in intensity depending on whether or not there are recording pits, and once again passes through the optical system of the optical pickup, enters the wavelength separating element 60 of the hologram laser 100 and transmitted by the separating filter 61, and finally diffracted by the hologram 52 and converged onto the light receiving surface of the photodiode 44.

DVD reflected light and CD reflected light is diffracted by the small gratings of the holograms 51 and 52, and arrives at the plurality of light receiving regions S1 to S10 shown in FIG. 3. The signals detected by the light receiving regions can be selectively used to create focus error signals, RF signals, and tracking error signals when reading CDs and when reading DVDs. For example, focus error signals when reading CDs and DVDs can be created for example by the knife edge method or the spot size method, tracking error signals when reading CDs can be created for example by the three-beam method or by the DPP method, using the diffraction grating 53, and tracking error signals when reading a DVD can be created for example by the differential phase detection (DPD) method.

Figure 6C:
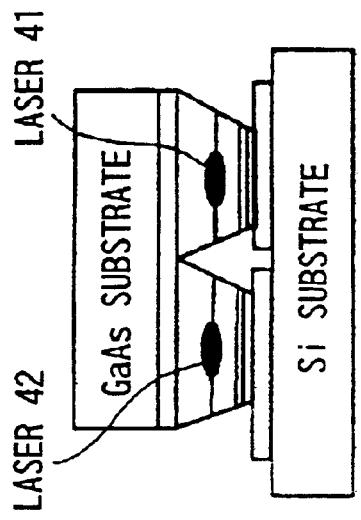
FIGS. 6A to 6D are a cross-sectional views illustrating examples of how the semiconductor laser elements 41 and 42 are arranged.
Figure 6D:
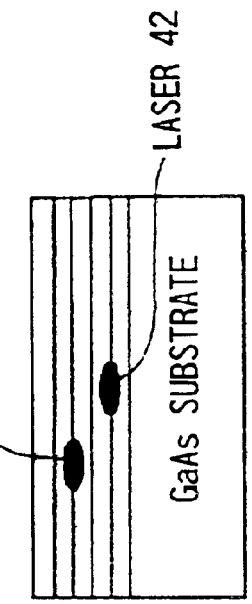
Figure 6A:
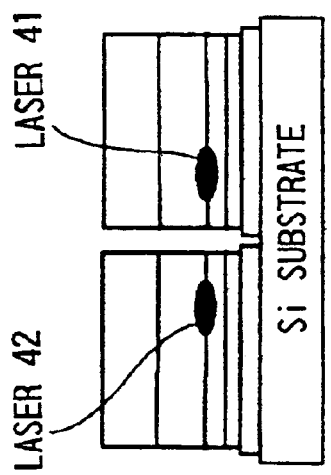

FIGS. 6A to 6D are cross-sectional views showing examples of the ways the semiconductor laser elements 41 and 42 can be arranged. FIG. 6A shows an example in which the semiconductor laser elements 41 and 42 are arranged by separately fixing two laser chips onto the same substrate (stem or sub-mount) made of Si or SiC, for example. With this configuration, the type of laser chips can be freely selected, so that the semiconductor laser element 41 of 650 nm wavelength can be configured for example by a low output (about 7 mW) laser for reproducing signal only, and the semiconductor laser element 42 of 780 nm wavelength can be configured by a high output (30 mW or more) laser for both reproducing and writing signals.

Figure 6B:
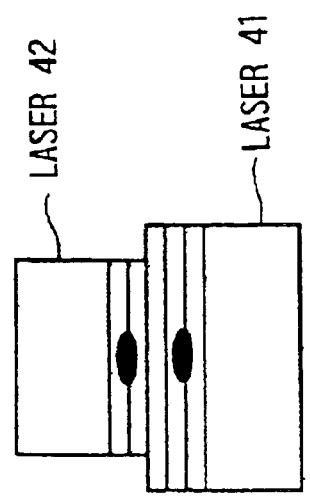

FIG. 6B illustrates a configuration in which two laser chips are stacked vertically. FIG. 6C illustrates a configuration in which two laser chips are integrated in parallel on the same substrate with the spacing between their respective light-emission points set to about 100 $\mu$m. FIG. 6D illustrates a configuration in which two laser chips are integrated diagonally on the same substrate with the spacing between their respective light-emission points set to about 20 $\mu$m.

In FIGS. 6B to 6D, two laser chips are formed as one unit on the same substrate made of GaAs, for example, so that the laser emission points can be positioned with high precision using a photomask, for example, and variations in the spacing between the light-emission points can be kept to about several $\mu$m, so the assembly precision of the holographic laser 100 can be increased.

Figure 7:
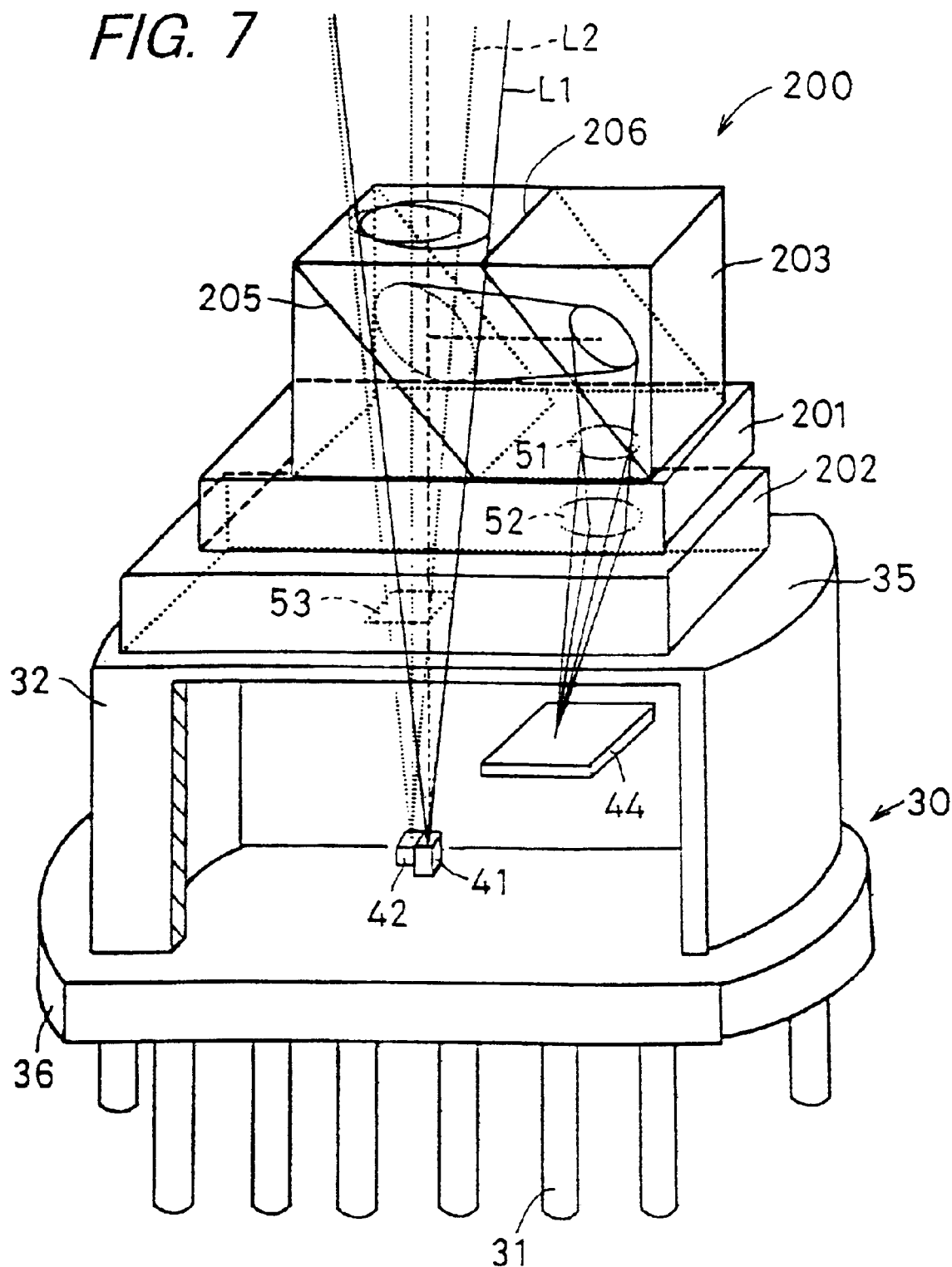
FIG. 7 is a partially transparent perspective view schematically showing the configuration of a holographic laser 200 according to a second embodiment of the invention.
Figure 8:
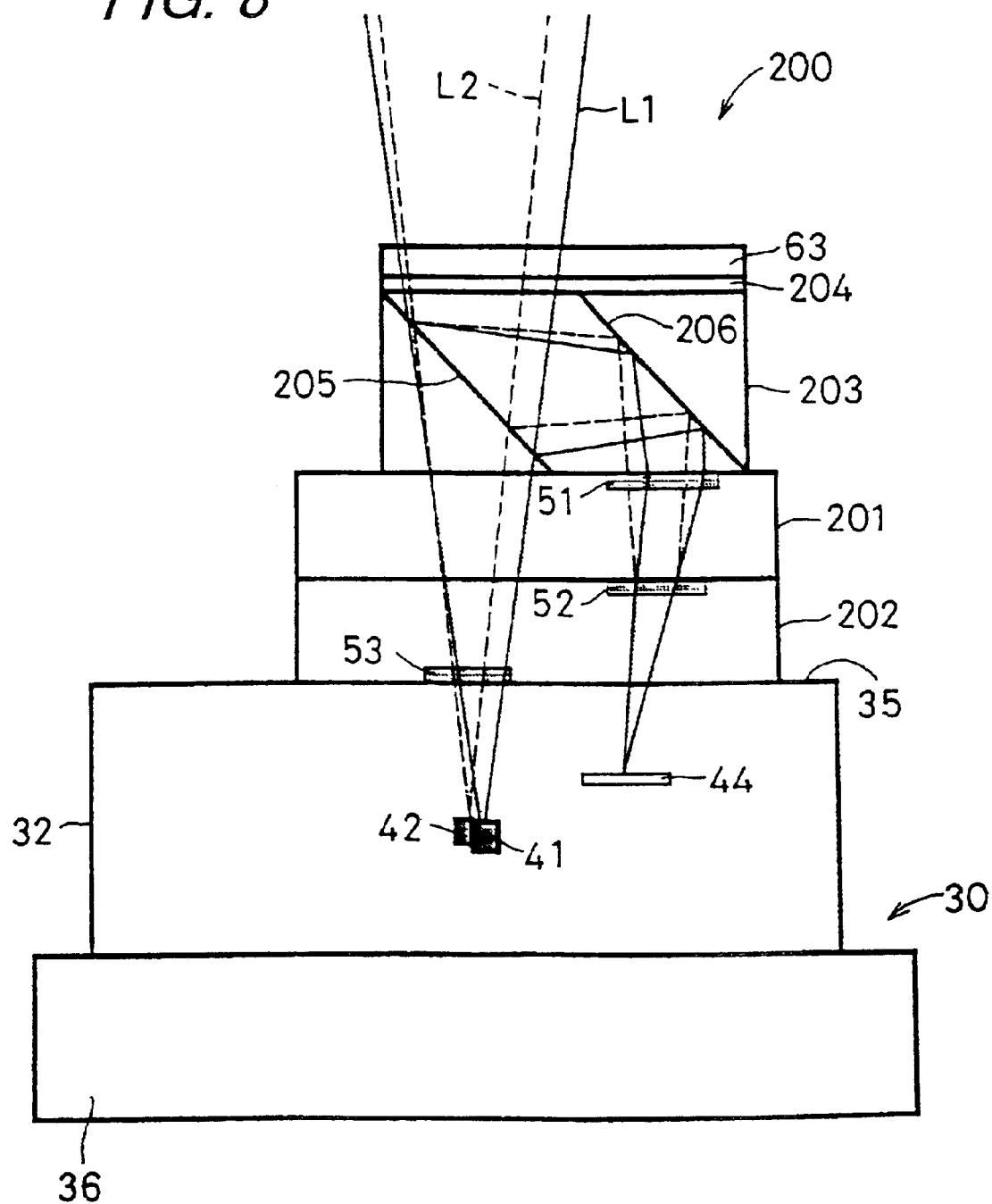
FIG. 8 is a cross-sectional view showing the internal configuration of the holographic laser 200 shown in FIG. 7.

FIG. 7 is a partially transparent perspective view schematically showing the configuration of a holographic laser 200 according to a second embodiment of the invention. FIG. 8 is a cross-sectional view showing the internal structure of the holographic laser 200 shown in FIG. 7. The holographic laser 200 of this embodiment is similar to the holographic laser 100 of the first embodiment, and corresponding parts are given the same reference numerals, omitting further explanation thereof.

The holographic laser 200 is provided with a wavelength separating element 203 for separating the light beam L1 and the light beam L2 reflected by the optical disk, a first holographic element 201 for focusing the light beam L1 separated by the wavelength separating element 203, and a second holographic element 202 for focusing the light beam L2 separated by the wavelength separating element 203. A characteristic feature here is that the first and second holographic elements 201 and 202 are provided separately. In this embodiment, the hologram 51 for diffracting and converging the L1 light having a wavelength of 650 nm is formed in the first holographic element 201, and the hologram 52 for diffracting and converging the L2 light having a wavelength of 780 nm is formed in the second holographic element 202.

The second holographic element 202, the first holographic element 201, and the wavelength separating element 203 are disposed in this order in the direction in which the light beam L1 and the light beam L2 are emitted from the first and second light sources 41 and 42 toward the optical disk, and a wavelength plate 204 is provided on the wavelength separating element 203 to the side opposite the first holographic element 201. It is also possible to provide a cover glass 63 above the wavelength plate 204.

The wavelength separating element 203 is provided with a polarizing prism 205 and a reflecting mirror 206. The polarizing prism 205 has the property of transmitting light when the direction of polarization of the laser is a p-wave, and reflects light when the direction of polarization of the laser is an s-wave. Here the wavelength plate 204 provided above the wavelength separating element 203 has a quarter-wavelength phase difference with respect to the light beam L1, which has a wavelength of 650 nm, and transforms the light beam L1 from a p-wave into an s-wave because the light beam L1, by twice passing through the wavelength plate 204, first as read light emitted from the first light source 41 and then as light reflected from the optical disk, is phase-shifted by half a wavelength. Consequently, the polarizing prism 205 transmits both read light beams L1 and L2 that are emitted from the first and second light sources 41 and 42, and reflects both the signal light beams L1 and L2 that are reflected by the optical disk and guides them to the reflecting mirror 206. Then, the light beam L1 or the light beam L2 reflected by the reflecting mirror 206 is transmitted through the first and second holograms 201 and 202 and, diffracted and converged, and then received by the light receiving element 44. Here the wavelength separating element 203 includes the polarizing prism 205, however, it is also possible to use a wavelength selecting filter instead of the polarizing prism 205.

In this embodiment the light receiving element 44 is disposed in the position described below. The light receiving element 44, the focal position of the 0th order diffracted light of the first and second holographic elements 201 and 202, and the first and second light sources 41 and 42 are each projected onto a virtual plane that is perpendicular to the optical axes of the light beam L1 or the light beam L2 emitted toward the optical disk from the first or second light sources 41 or 42. The light receiving element 44 is disposed such that when it is projected onto this virtual plane, it is positioned between the focal position of the 0th order diffracted light of the first and second holographic elements 201 and 202 and the first and second light sources 41 and 42 also projected onto the same virtual plane.

In the holographic element 200, the first and second holographic elements 201 and 202 are provided for the light beam L1 and the light beam L2, respectively, and the first holographic element 201 and the second holographic element 202 are disposed on top of one another and are capable of separately adjusting the optical axes and/or light paths of the light beam L1 and the light beam L2, which each have different wavelengths.

Figure 9:
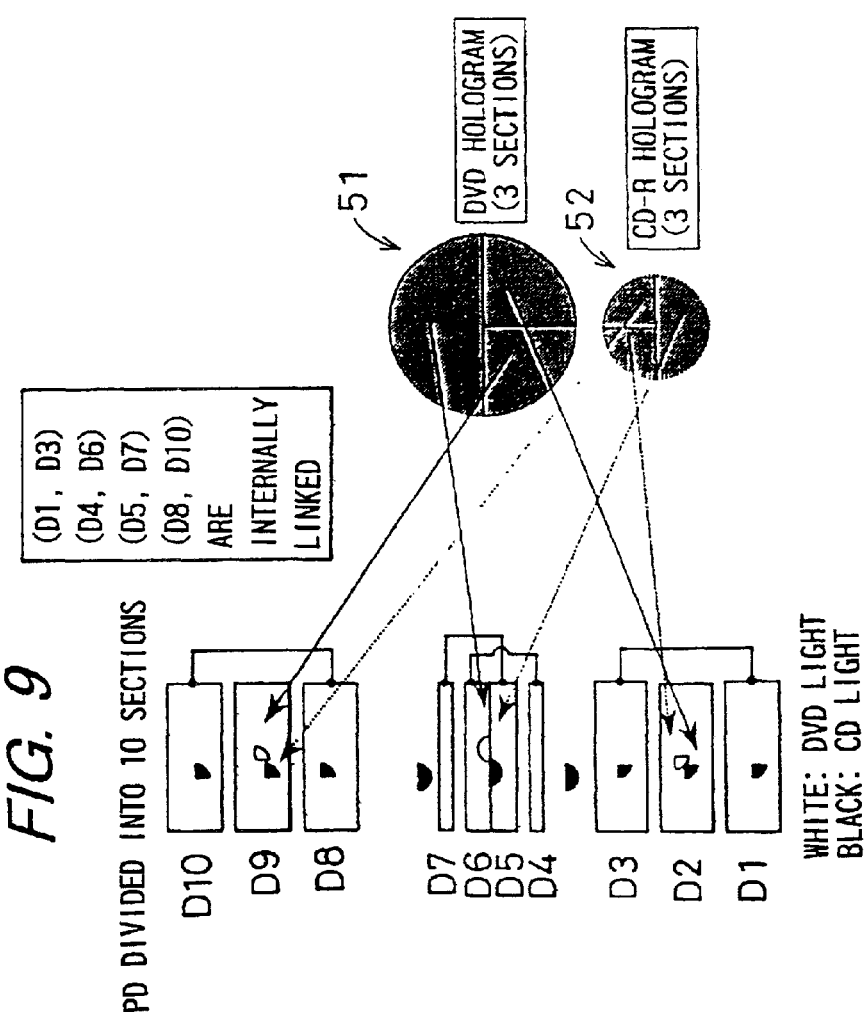
FIG. 9 is a diagram illustrating the optical relationship between the holograms 51 and 52 and the photodiode 44 in the holographic laser 200.

FIG. 9 is a diagram illustrating the optical relationship in the holographic laser 200 between the holograms 51 and 52 and the photo diode 44. Referring to FIG. 9, the following explains how the light beam L1 and the light beam L2 are received by the light receiving element 44. Like in the holographic laser 100 of the first embodiment, the light receiving regions D1 to D10 of the photodiode 44 have the elongated shape depicted in FIG. 9, and are set such that in their longitudinal direction they are parallel to the direction of diffraction of the small grating to which they correspond. In FIG. 9 the black semicircles and the black quarter-circles are the reflection spots of a CD, and the white semicircles and the white quarter-circles are the reflection spots of a DVD.

Signal detection during the read out of CDs takes places as follows. The light receiving regions D4, D6, D5, and D7 detect focus error signals (FESs), the light receiving regions D2, D4, D6, D5, D7, and D9 detect RF signals, and the light receiving regions D1, D2, D3, D8, D9, and D10 detect tracking error signals.

Signal detection during the read out of DVDs takes places as follows. The light receiving regions D4, D6, D5, and D7 detect focus error signals (FESS), the light receiving regions D2, D4, D6, D5, D7, and D9 detect RF signals, and the light receiving regions D2 and D9 detect tracking error signals.

Next is a description of how signals are read out from optical disks with the holographic laser 200 of this embodiment. First, when a DVD is set as the optical disk, the light beam L1 having 650 nm wavelength for reading DVDs is emitted from the first light source 41 and passes through the polarizing prism 205 of the wavelength separating element 203, is then transmitted by the wavelength plate 204, where it is phase-shifted by a quarter wavelength, and then passes through the optical system of the optical pickup and is focused on the recording surface of the DVD. When the light beam L1 arrives at the recording surface of the DVD it has passed through the first and second holographic elements 201 and 202, however, it has not passed through the holograms 51 and 52 formed in the first and second holographic elements 201 and 202, respectively.

The intensity of the light reflected by the DVD changes depending on whether there are recording pits and the reflected light is once again passed through the optical system of the optical pickup, and then by once again passing through the wavelength plate 204 it is phase-shifted by a quarter wavelength (resulting in a total phase shift of half a wavelength) and is incident on the wavelength separating element 203. This light beam L1 incident on the wavelength separating element 203 is reflected by the polarizing prism 205 and the reflecting mirror 206, and is guided to the hologram 51 formed in the first holographic element 201. The light beam L1 is then diffracted by passing through the hologram 51, which generates primarily −1st order diffracted light, 0th order diffracted light, and +1st order diffracted light. The relative positional relationship of the hologram 51 and the hologram 52 is determined such that, of these diffraction lights, the +1st order diffracted light is not incident on the hologram 52 formed in the second holographic element 202.

The holograms have been arranged such that the −1st order diffracted light and the 0th order diffracted light diffracted by the hologram 51 are both incident on the hologram 52. Here, the −1st order diffracted light is used for signal detection, so it is preferably received by the light receiving element without passing through the hologram 52. However, to meet demands for more compact apparatus there are often limitations placed on the dimensions for the package 30, so that it is difficult to position the holograms such that neither the −1st order diffracted light nor the 0th order diffracted light pass through the hologram 52 and furthermore that only the −1st order diffracted light is received by the light receiving element 44. Consequently, in this embodiment the holograms are arranged such that all of the −1st order diffracted light and the 0th order diffracted light are passed through the hologram 52 to prevent non-uniformities in the quantity of light caused by whether or not the light is passed through the hologram 52. Furthermore, the positions of the holograms were determined so that the light receiving element 44 is positioned in the above-mentioned virtual plane between the first light source 41 and the focal position of the 0th order diffracted light of the light beam L1 generated by the hologram 51, such that, of the −1st order diffracted light and the 0th order diffracted light that are passed through the hologram 52, only the −1st order diffracted light can be received by the light receiving element 44. Thus, signal detection using only the −1st order diffracted light is achieved.

On the other hand, when a CD is set as the optical disk, the light beam L2 having 780 nm wavelength for reading CDs is emitted from the second light source 42 and passes through the polarizing prism 205 of the wavelength separating element 203 and then passes through the wavelength plate 204 and the optical system of the optical pickup and is focused on the recording surface of the CD. At this time, the light beam L2 passes through the first and second holographic elements 201 and 202, however, it does not pass through the holograms 51 and 52 formed in the first and second holographic elements 201 and 202, respectively, before arriving at the recording surface of the CD.

The intensity of light reflected by the CD changes depending on whether there are recording pits and the reflected light is once again passed through the optical system of the optical pickup and the wavelength plate 204 and is incident on the wavelength separating element 203. The light beam L1 incident on the wavelength separating element 203 is reflected by the polarizing prism 205 and the reflecting mirror 206, and is guided into the hologram 51 formed in the first holographic element 201.

The light beam L2, however, is completely transmitted by the hologram 51, and furthermore the positioning of the hologram 51 and the hologram 52 is determined such that after being transmitted by the hologram 51 all of this light is then incident on the hologram 52. This is to prevent non-uniformities in the quantity of light of the signal received by the light receiving element 44, which result from differences in the quantity of light due to the existence of light that is passed through the holograms 51 and 52 and light that is not passed through the holograms 51 and 52.

In particular, the hologram 51 for diffracting the light beam L1 may also diffract the light beam L2. When the light beam L2 is diffracted by the hologram 51, even though only 0th order diffracted light from the hologram 51 is used for signal detection, because of apparatus compactness limitations it is difficult to arrange the holograms such that only 0th order diffracted light and no ±1st order diffracted light is incident on the hologram 52, and therefore as described earlier the holograms are arranged such that all of the light beam L2 that passes through the hologram 51 is incident on the hologram 52.

Of the light beam L2 that is diffracted by passing through the hologram 52, which was formed originally in the second holographic element 202 for the purpose of diffracting the light beam L2, only the −1st order diffracted light is used for signal detection, so the hologram 52 and the light receiving element 44 are arranged such that in the above-mentioned virtual plane they are located between the second light source 42 and the focal position of the 0th order diffracted light of the light beam L2 caused by the hologram 52, such that only the −1st order diffracted light of the light beam L2 caused by the hologram 52 is received and its 0th order and +1st order diffracted light is not received.

Thus, with the holographic laser 200 of this embodiment, it is possible to separately adjust the optical axes and/or paths of the different wavelength light beams L1 and L2, thus contributing to increasing the production efficiency of the apparatus without requiring a high degree of assembly precision. Moreover, the light beams L1 and L2 do not pass through the holograms 51 and 52 between being emitted from the first and second light sources 41 and 42 and arriving at the optical disk, so there is no quantitative loss of light due to the creation of diffracted light, and information can be written to or read from an optical disk at high light intensities.

Figure 10:
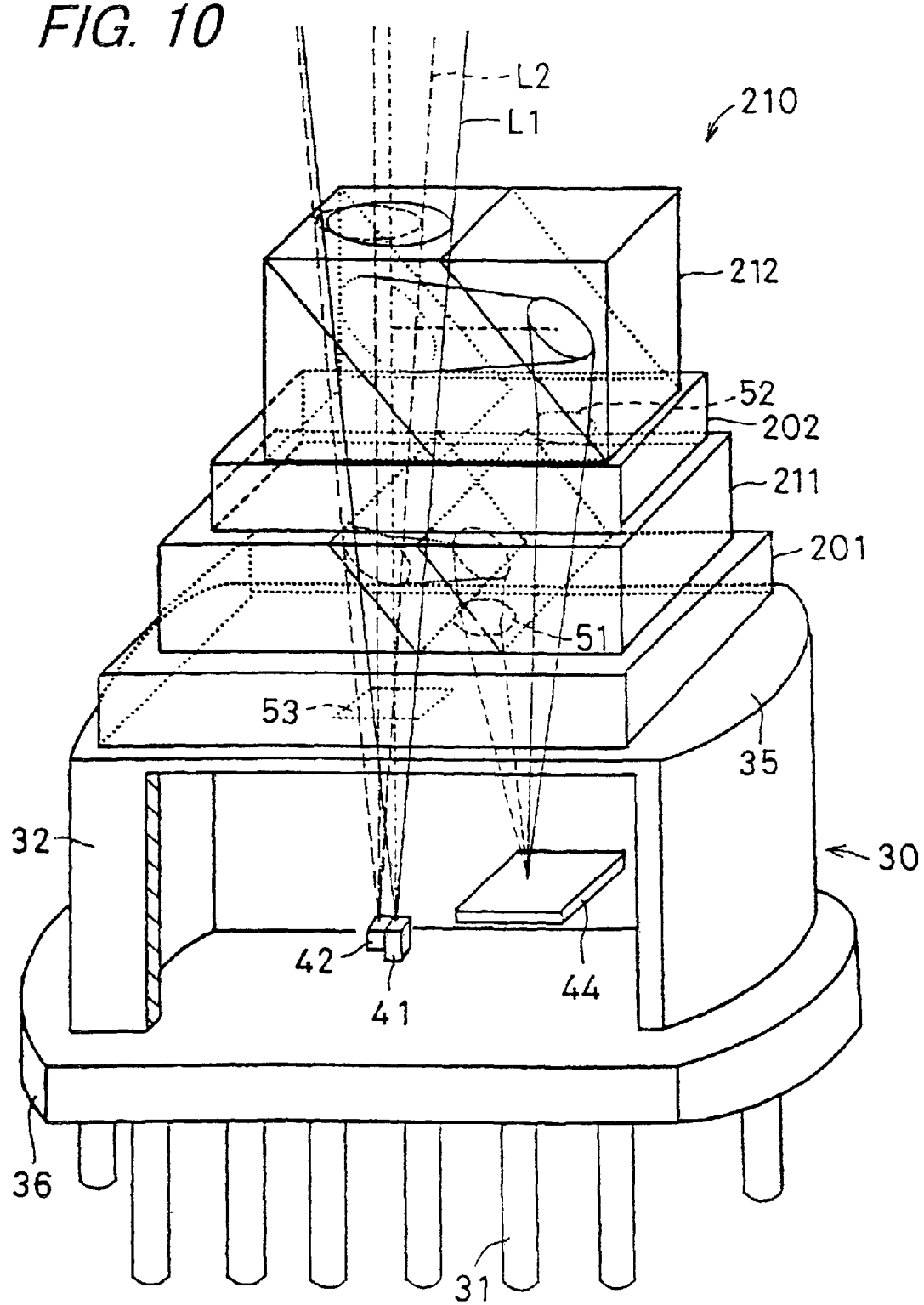
FIG. 10 is a partially transparent perspective view schematically showing the configuration of a holographic laser 210 according to a third embodiment of the invention.
Figure 11:
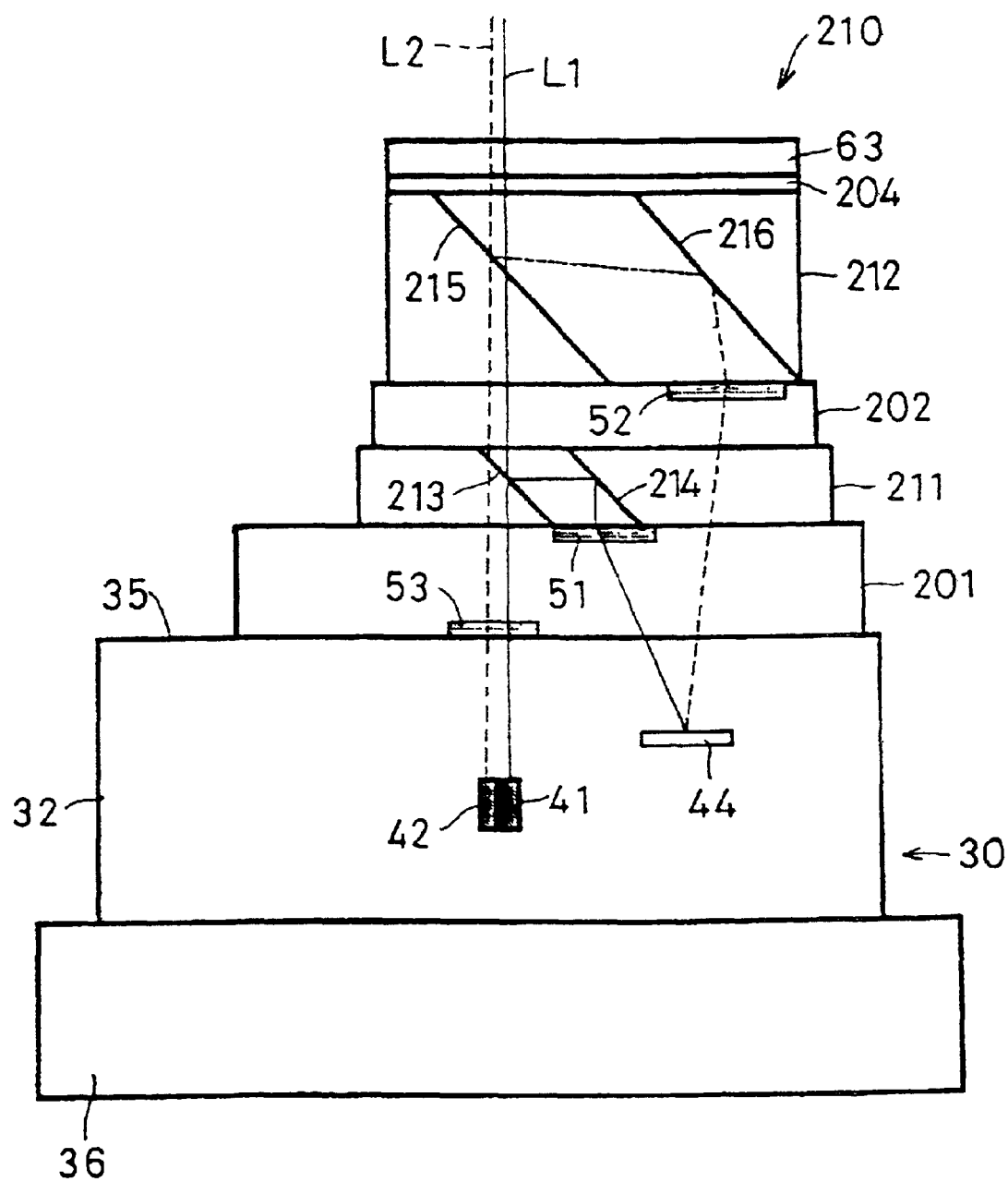
FIG. 11 is a cross-sectional view showing the internal configuration of the holographic laser 210 shown in FIG. 10.

FIG. 10 is a partially transparent perspective view schematically illustrating the structure of a holographic laser 210 according to a third embodiment of the invention. FIG. 11 is a cross-sectional view illustrating the internal structure of the holographic laser 210 shown in FIG. 10. The holographic laser 210 of this embodiment is similar to the holographic laser 200 of the second embodiment, so corresponding parts are given the same reference numerals, omitting their further explanation.

The holographic laser 210 is provided with a first wavelength separating element 211 for wavelength separation of the light beam L1 reflected by an optical disk, a second wavelength separating element 212 for wavelength separation of the light beam L2 reflected by an optical disk, a first holographic element 201 for focusing the light beam L1 that has been separated by the first wavelength separating element 211, and a second holographic element 202 for focusing the light beam L2 that has been separated by the second wavelength separating element 212. A characteristic feature here is that the first and second holographic elements 201 and 202 and the first and second wavelength separating elements 211 and 212 are provided separately. In this embodiment, a hologram 51 for diffracting and converging the light beam L1 of a wavelength of 650 nm is formed in the first holographic element 201, and a hologram 52 for diffracting and converging the light beam L2 of a wavelength of 780 nm is formed in the second holographic element 202.

The first holographic element 201, the first wavelength separating element 211, the second holographic element 202, and the second wavelength separating element 212 are arranged in this order in the direction in which the light beam L1 and the light beam L2 are emitted from the first and second light source 41 and 42 toward the optical disk. A wavelength plate 204 is provided on the second wavelength separating element 212 on the side opposite the second holographic element 202. It is also possible to provide a cover glass 63 above the wavelength plate 204.

The first wavelength separating element 211 is provided with a polarizing prism 213 and a reflecting mirror 214. The polarizing prism 213 has the characteristic that it transmits light when the polarization direction of the laser is that of a p-wave, and reflects light when the polarization direction of the laser is that of an s-wave. Like in the second embodiment, the light beam L1 emitted from the first laser source 41 is phase-shifted by half a wavelength by twice passing through the polarizing plate 204, first as read light and then as light reflected from the optical disk, and thereby transformed from p-wave to s-wave light. Consequently, the polarizing prism 213 transmits the read light of the light beam L2 emitted from the first light source 41 and reflects the signal light of the light beam L1 that is reflected from the optical disk and guides it toward the reflecting mirror 214. Moreover, the light beam L1 reflected by the reflecting mirror 214 is then diffracted and converged by passing through the first holographic element 201, and is received by the light receiving element 44. It should be noted that the light beam L2 that is reflected by the optical disk is then reflected by the second wave length separating element 212, which is described below, and thus the holographic laser 210 is configured such that the reflected light beam L2 is not incident on the first wavelength separating element 211.

The second wavelength separating element 212 is provided with a wavelength selecting filter 215 and a reflecting mirror 216. The wavelength selecting filter 215 has the feature of reflecting the 780 nm wavelength light beam L2 and transmitting the 650 nm wavelength light beam L1, and transmits the read light of the light beam L2 emitted from the second light source 42, but reflects the signal light of the light beam L2 that is reflected from the optical disk and guides it to the reflecting mirror 216. Then, the light beam L2 that is reflected by the reflecting mirror 216 is diffracted and focused by passing through the second holographic element 202, and is received by the light receiving element 44.

In this embodiment, the light receiving element 44 is disposed between the focal position of the 0th order diffracted light of the first holographic element 201 and the focal position of the 0th order diffracted light of the second holographic element 202. More specifically, the light receiving element 44 is arranged in a position such that it receives the +1st order diffracted light but not the 0th order and −1st order diffracted light of the light beam L1 that is diffracted by the first holographic element 201, and that it receives the −1st order diffracted light and but not the 0th order or +1 order light of the light beam L2 that is diffracted by the second holographic element 202.

In the holographic laser 210, the first and second holographic elements 201 and 202 and the first and second wavelength separating elements 211 and 212 are provided for the light beams L1 and L2, respectively. The first holographic element 201, the first wavelength separating element 211, the second holographic element 202, and the second wavelength separating element 212 are disposed stacked top of one another and are capable of separately adjusting the light axes and/or the paths of the light beam L1 and the light beam L2, which have different wavelengths.

Figure 12:
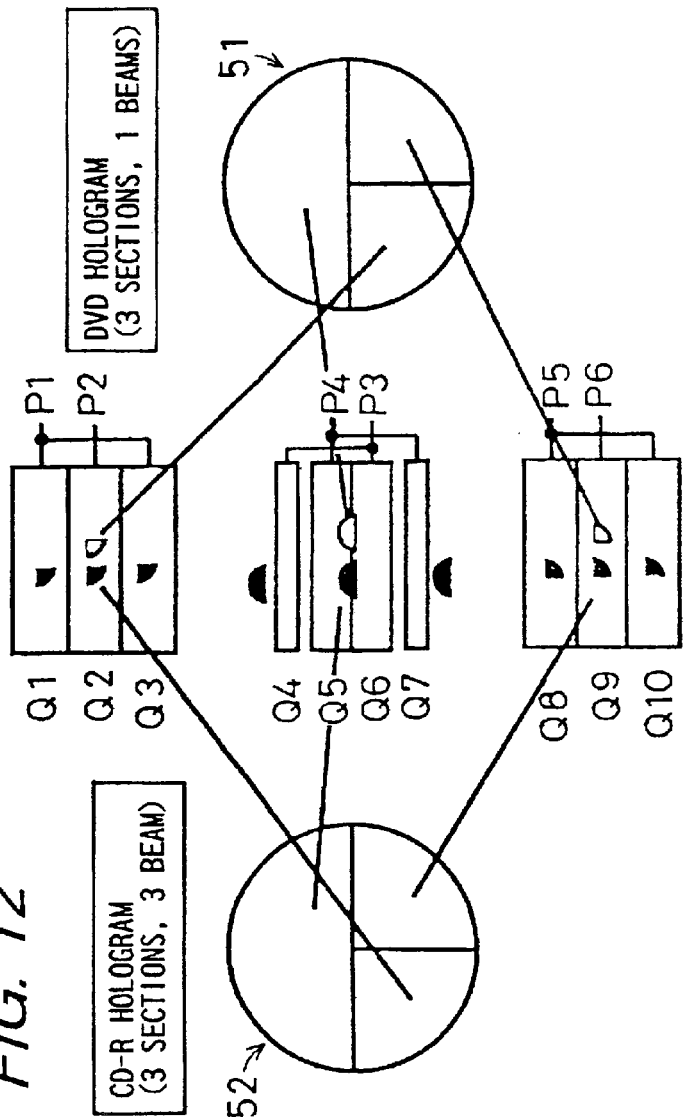
FIG. 12 is a diagram illustrating the optical relationship between the holograms 51 and 52 and the photodiode 44 in the holographic laser 210.
Figure 13:
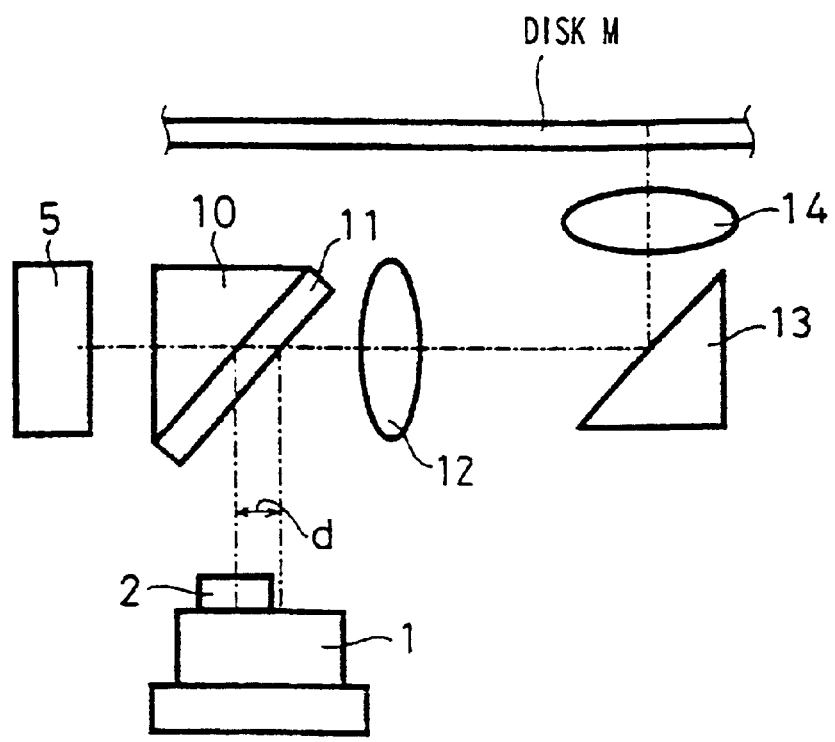
FIG. 13 is a structural diagram illustrating an example of a conventional optical pickup.
Figure 14:
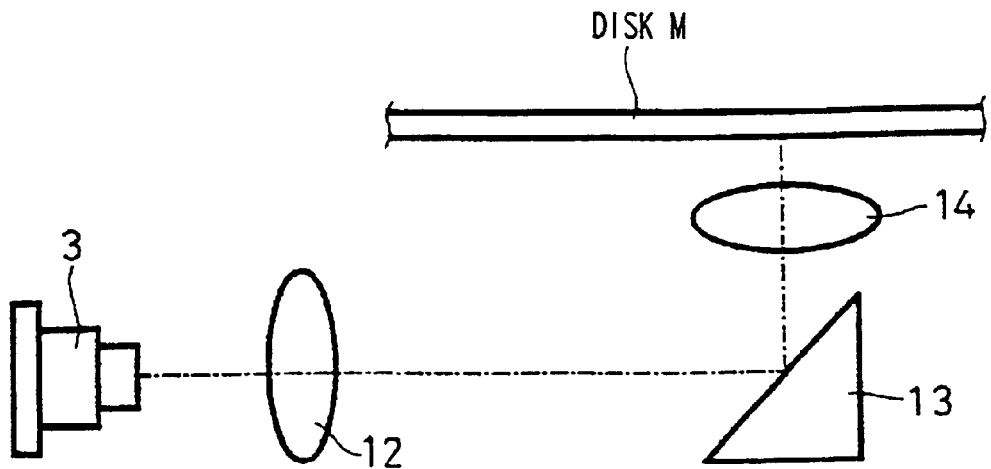
FIG. 14 is a structural diagram illustrating another example of a conventional optical pickup.

FIG. 12 is a diagram illustrating the optical relationship between the holograms 51 and 52 and the photodiode 44 in the holographic laser 210. Referring to FIG. 12, the following describes how the light beam L1 and the light beam L2 are received by the light receiving element 44. Like the holographic laser 200 of the second embodiment, the light receiving regions Q1 to Q10 of the photodiode 44 have the elongated shape shown in FIG. 12, and are arranged such that their longitudinal direction is parallel to the direction of diffraction of the small grating to which they correspond. In FIG. 12 the black half-circles and the black quarter-circles are the reflection spots of a CD, and the white half-circles and the white quarter-circles are the reflection spots of a DVD.

Signal detection during the read out of CDs takes places as follows. The light receiving regions Q4, Q6, Q5, and Q7 detect focus error signals (FESS), the light receiving regions Q2, Q4, Q6, Q5, Q7, and Q9 detect RF signals, and the light receiving regions Q1, Q2, Q3, Q8, Q9, and Q10 detect tracking error signals.

Signal detection during the read out of DVDs takes places as follows. The light receiving regions Q4, Q6, Q5, and Q7 detect focus error signals (FESS), the light receiving regions Q2, Q4, Q6, Q5, Q7, and Q9 detect RF signals, and the light receiving regions Q2 and Q9 detect tracking error signals.

Next is a description of how signals are read out from optical disks with the holographic laser 210 of this embodiment. First, when a DVD is set as the optical disk, the light beam L1 having 650 nm wavelength for reading DVDs is emitted from the first light source 41 and is transmitted by the first holographic element 201 and the polarizing prism 213 of the first wavelength separating element 211, is next transmitted by the second holographic element 202 and the wavelength selecting filter 215 of the second wavelength separating element 212, and is then further transmitted by the wavelength plate 204, where it is phase-shifted by a quarter wavelength, after which it passes through the optical system of the optical pickup and is focused on the recording surface of the DVD. It should be noted that as mentioned earlier, the light beam L1 has passed through the first and second holographic elements 201 and 202, however, it has not passed through the holograms 51 and 52 formed in the first and second holographic elements 201 and 202, respectively, before arrives at the recording surface of the DVD.

Light reflected by the DVD changes in intensity depending on whether there are recording pits, is again passed through the optical system of the optical pickup, and then, by once again passing through the wavelength plate 204, it is phase-shifted by a quarter wavelength (resulting in a total phase shift of half a wavelength) and is incident on the second wavelength separating element 212. This light beam L1 incident on the second wavelength separating element 212 is transmitted through the wavelength selecting filter 215, which has the property of transmitting light having a wavelength of 650 nm, is again transmitted through a portion of the second holographic element 202 in which the hologram 52 is not formed, and then is incident on the first wavelength separating element 211.

The light beam L1 that is incident on the first wavelength separating element 211 is reflected by the polarizing prism 213 and the reflecting mirror 214 and guided to the hologram 51 formed in the first holographic element 201. By passing through the hologram 51, the light beam L1 is diffracted primarily into −1st order diffracted light, 0th order diffracted light, and +1st order diffracted light, and as illustrated earlier, the hologram 51 and the light receiving element 44 are disposed such that the light receiving element 44 receives only the +1st order diffracted light. Consequently, only the +1st order diffracted light is used for signal detection, and the 0th order and −1st order diffracted light are not used.

On the other hand, when a CD is set as the optical disk, the light beam L2 having 780 nm wavelength for reading CDs is emitted from the second light source 42 and is transmitted by the first holographic element 201 and the polarizing prism 213 of the first wavelength separating element 211, then transmitted through second holographic element 202 and the wavelength selecting filter 215 of the second wavelength separating element 212, and finally passes through the wavelength plate 204 and is focused on the recording surface of the CD. At this time, the light beam L2 passes through the first and second holographic elements 201 and 202, however, it does not pass through the holograms 51 and 52 formed in the first and second holographic elements 201 and 202, respectively, before it arrives at the recording surface of the CD.

Light reflected by the CD changes in intensity depending on whether there are recording pits, and is once again passed through the optical system of the optical pickup and the wavelength plate 204 and is incident on the second wavelength separating element 212. The light beam L2 incident on the second wavelength element 212 is reflected by the wavelength selecting filter 215, which has the property of reflecting light having 780 nm wavelength, and the reflecting mirror 216, and guided to the hologram 52 formed in the second holographic element 202.

The light beam L2 is diffracted by passing through the hologram 52 and becomes primarily −1st order diffracted light, 0th order diffracted light, and +1st order diffracted light, and as described above the positions of the hologram 52 and the light receiving element 44 are determined such that the light receiving element 44 receives only the −1st order diffracted light. Consequently, only the −1st order diffracted light is used for signal detection, and the 0th order and +1st order diffracted light are not used.

Thus, the holographic laser 210 in this embodiment is capable of separately adjusting the optical axes and light paths of the light beams L1 and L2, which have different wavelengths, and because the light beams L1 and L2 do not pass through the holograms 51 and 52 between being emitted from the first and second light sources 41 and 42 and arriving at the optical disk, the same effects as the holographic laser 200 of the second embodiment can be achieved.

As detailed in the above, in the first through third embodiments of the invention, the first light source 41 is a semiconductor laser which emits a light beam L1 of 650 nm wavelength, and the second light source 42 is a semiconductor laser which emits a light beam L2 of 780 nm wavelength, however, the invention is not limited to this, and it is also possible to shift the wavelength of the light emitted by the first light source 41 and the second light source 42 to a shorter wavelengths or to longer wavelengths. Needless to say, if the wavelengths are shifted in this way, it is of course necessary to change the positions of the first and second holographic elements 201 and 202 and the first and second wavelength separating elements 211 and 212 correspondingly.

Furthermore, focus error signals, RF signals, and tracking error signals are detected from the signals retrieved at each light receiving region of the light receiving element 44, however, the invention is not limited to this, and it is also possible to internally link a plurality of light receiving regions in a predetermined combination and use the signals retrieved from this plurality of internally linked light receiving regions to detect the focus error signals, the RF signals, and the tracking error signals. Consequently, the number of output terminals from the light receiving element can be reduced, so that it is possible to simplify the wiring when assembling into the apparatus.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A holographic laser comprising:
   a first light source for emitting a light beam L1 of a first wavelength toward an optical disk;
   a second light source for emitting a light beam L2 of a second wavelength different from the first wavelength toward an optical disk, the second light source being positioned near the first light source;
   a wavelength separating element for separating the light beam L1 and the light beam L2 reflected by the respective optical disks;
   a first holographic element for converging the light beam L1 separated by the wavelength separating element;
   a second holographic element for converging the light beam L2 separated by the wavelength separating element; and
   a light receiving element for receiving the light beam L1 converged by the first holographic element and the light beam L2 converged by the second holographic element,
   wherein the first holographic element is arranged at a position so that the light beam L1 of the first wavelength emitted from the first light source toward the optical disk does not pass through the first holographic element and the light beam L1 of the first wavelength reflected by the optical disk passes through the first holographic element;
   wherein the second holographic element is arranged at a position so that the light beam L2 of the second wavelength emitted from the second light source toward the optical disk and the light beam L2 reflected by the optical disk pass through the second holographic element;
   wherein the light receiving element is positioned between a focal position of 0th order diffracted light of the first holographic element and a focal position of 0th order diffracted light of the second holographic element; and
   wherein the first light source, the second light source, the wavelength separating element, the first holographic element, and the second holographic element are integrally formed into a single component.

2. The holographic laser of claim 1, wherein directions of diffraction of the first holographic element and the second holographic element are substantially parallel to an alignment direction of the first holographic element and the second holographic element.

3. The holographic laser of claim 1, wherein an alignment direction of the first light source and the second light source is substantially parallel to an alignment direction of the first holographic element and the second holographic element.

4. The holographic laser of claim 1, wherein the first holographic element and the second holographic element have a substantially equal grating pitch.

5. The holographic laser of claim 1, wherein the first holographic element and the second holographic element have a plurality of small gratings which are divided into a plurality of regions, and grating pitches of the small gratings on the same holographic element are substantially equal.

6. The holographic laser of claim 5, wherein the light receiving element has a plurality of light receiving regions for receiving light diffracted by the small gratings of the first holographic element and the second holographic element,
   a first light receiving region of the light receiving regions detects diffracted light including RF signals of a compact disk and diffracted light including RF signals of a digital versatile disk, and
   a second light receiving region of the light receiving regions detects diffracted light including RF signals of a compact disk and diffracted light including phase difference signals of a digital versatile disk.

7. The holographic laser of claim 6, wherein a shape of the second light receiving region is that of two intersecting parallelograms extending along directions of diffraction of the holographic elements, wherein one of four corners of one of the parallelograms exists within the other parallelogram.

8. The holographic laser of claim 6, wherein the plurality of light receiving regions are aligned perpendicular to an alignment direction of the first holographic element and the second holographic element.

9. The holographic laser of claim 1, wherein the light receiving element is positioned so as to be closer to the focal position of 0th order diffracted light from the holographic element which converges light of the shorter wavelength of the light beam L1 and the light beam L2 than to the focal position of 0th order diffracted light from the holographic element which converges light of the longer wavelength of the light beam L1 and the light beam L2.

10. A holographic laser comprising:
- a first light source for emitting a light beam L1 of a first wavelength toward an optical disk;
- a second light source for emitting a light beam L2 of a second wavelength different from the first wavelength toward an optical disk, the second light source being positioned near the first light source;
- a wavelength separating element for separating the light beam L1 and the light beam L2 reflected by the respective optical disks;
- a first holographic element for converging the light beam L1 separated by the wavelength separating element;
- a second holographic element for converging the light beam L2 separated by the wavelength separating element; and
- a light receiving element for receiving the light beam L1 converged by the first holographic element and the light beam L2 converged by the second holographic element,
- wherein the second holographic element, the first holographic element, and the wavelength separating element are arranged in this order in a direction in which the light beam L1 and the light beam F2 are emitted from the first and second light sources toward the respective optical disks,
- wherein the first holographic element is arranged at a position so that the light beam L1 of the first wavelength emitted from the first light source toward the optical disk does not pass through the first holographic element, and the light beam L1 of the first wavelength reflected by the optical disk passes through the first holographic element;
- wherein the second holographic element is arranged at a position so that the light beam L2 of the second wavelength emitted from the second light source toward the optical disk does not pass through the second holographic element, and the light beam L2 reflected by the optical disk passes through the second holographic element;
- wherein the light receiving element is arranged so as to be located between a couple of the focal positions of the 0th order diffracted light of the first and second holographic elements and a couple of the first and second light sources on a virtual plane perpendicular to an optical axis of the light beam L1 or light beam L2 emitted toward the optical disk from the first or second light source onto which plane the light receiving element is projected, and
- wherein the first light source, the second light source, the wavelength separating element, the first holographic element, and the second holographic element are formed integrally into a single component.

11. The holographic laser of claim 10, wherein holograms formed in the first and second holographic elements are positioned away from light paths formed by the light beam L1 and the light beam L2 from the first and second light sources to the optical disk.

12. The holographic laser of claim 10, wherein the light beam L1 and the light beam L2 have different wavelengths, and the wavelength separating element separates the wavelengths of both the light beam L1 and the light beam L2.

13. The holographic laser of claim 10, wherein the hologram formed in the first holographic element and the hologram formed in the second holographic element are positioned such that plus first-order diffracted light of the light beam L1 diffracted by the hologram formed in the first holographic element does not pass through the hologram formed in the second holographic element.

14. The holographic laser of claim 10, wherein the hologram formed in the first holographic element and the hologram formed in the second holographic element are positioned such that all of the light beam L2 passes through the hologram formed in the first holographic element and is incident on the hologram formed in the second holographic element.

15. The holographic laser of claim 10, wherein a hologram formed in the first holographic element and a hologram formed in the second holographic element are positioned such that all of the light beam L2 that passes through the hologram formed in the first holographic element also passes through the hologram formed in the second holographic element; and

- the hologram formed in the second holographic element and the light receiving element are positioned such that neither plus first nor minus first order diffracted light that is diffracted by the hologram formed in the second holographic element is incident on the light receiving element.

16. A holographic laser comprising:
- a first light source for emitting a light beam L1 of a first wavelength toward an optical disk;
- a second light source for emitting a light beam L2 of a second wavelength different from the first wavelength toward an optical disk, the second light source being positioned near the first light source;
- first and second wavelength separating elements for respectively separating the light beam L1 and the light beam L2 reflected by the respective optical disks;
- a first holographic element for converging the light beam L1 separated by the first wavelength separating element;
- a second holographic element for converging the light beam L2 separated by the second wavelength separating element; and
- a light receiving element for receiving the light beam L1 converged by the first holographic element and the light beam L2 converged by the second holographic element;
- wherein the first holographic element, the first wavelength separating element, the second holographic element, and the second wavelength separating element are arranged in this order in a direction in which the light beam L1 and the light beam L2 are emitted from the first and second light sources toward the respective optical disks;
- wherein the first holographic element is arranged at a position so that the light beam L1 of the first wavelength emitted from the first light source toward the optical disk does not pass through the first holographic element, and the light beam L1 of the first wavelength reflected by the optical disk passes through the first holographic element;
- wherein the second holographic element is arranged at a position so that the light beam L2 of the second wavelength emitted from the second light source toward the optical disk does not pass through the second holographic element and the light beam L2 reflected by the optical disk passes through the second holographic element;

wherein the light receiving element is positioned between a focal position of 0th order diffracted light of the first holographic element and a focal position of 0th order diffracted light of the second holographic element; and wherein the first light source, the second light source, the first wavelength separating element, the second wavelength separating element, the first holographic element, and the second holographic element are formed integrally into a single component.

17. The holographic laser of claim 16, wherein holograms formed in the first and second holographic elements are positioned away from light paths formed by the light beam L1 and the light beam L2 from the first and second light sources to the optical disk.

18. The holographic laser of claim 16, wherein the light beam L1 and the light beam L2 have different wavelengths, and the first wavelength separating element separates only the light beam L1 wavelength, and the second wavelength separating element separates only the light beam L2 wavelength.

19. An optical laser pickup comprising:

a holographic laser comprising:

a first light source for emitting a light beam L1 of a first wavelength toward an optical disk;

a second light source for emitting a light beam L2 of a second wavelength different from the first wavelength toward an optical disk, the second light source being positioned near the first light source;

a wavelength separating element for separating the light beam L1 and the light beam L2 reflected by the respective optical disks;

a first holographic element for converging the light beam L1 separated by the wavelength separating element;

a second holographic element for converging the light beam L2 separated by the wavelength separating element; and a light receiving element for receiving the light beam L1 converged by the first holographic element and the light beam L2 converged by the second holographic element, wherein the first holographic element is arranged at a position so that the light beam L1 of the first wavelength emitted from the first light source toward the optical disk does not pass through the first holographic element, and the light beam L1 of the first wavelength reflected by the optical disk passes through the first holographic element;

wherein the second holographic element is arranged at a position so that the light beam L2 of the second wavelength emitted from the second light source toward the optical disk and the light beam L2 reflected by the optical disk pass through the second holographic element;

wherein the light receiving element is positioned between a focal position of 0th order diffracted light of the first holographic element and a focal position of 0th order diffracted light of the second holographic element; and wherein the first light source, the second light source, the wavelength separating element, the first holographic element, and the second holographic element are integrally formed into a single component; and an optical system for guiding light emitted from the holographic laser to an optical disk and guiding light reflected from the optical disk to the holographic laser.

20. An optical laser pickup comprising:

a holographic laser comprising:

a first light source for emitting a light beam L1 of a first wavelength toward an optical disk;

a second light source for emitting a light beam L2 of a second wavelength different from the first wavelength toward an optical disk, the second light source being positioned near the first light source;

a wavelength separating element for separating the light beam L1 and the light beam L2 reflected by the respective optical disks;

a first holographic element for converging the light beam L1 separated by the wavelength separating element;

a second holographic element for converging the light beam L2 separated by the wavelength separating element; and a light receiving element for receiving the light beam L1 converged by the first holographic element and the light beam L2 converged by the second holographic element, wherein the second holographic element, the first holographic element, and the wavelength separating element are arranged in this order in a direction in which the light beam L1 and the light beam L2 are emitted from the first and second light sources toward the respective optical disks, wherein the first holographic element is arranged at a position so that the light beam L1 of the first wavelength emitted from the first light source toward the optical disk does not pass through the first holographic element, and the light beam L1 of the first wavelength reflected by the optical disk passes through the first holographic element;

wherein the second holographic element is arranged at a position so that the light beam L2 of the second wavelength emitted from the second light source toward the optical disk does not pass through the second holographic element, and the light beam L2 reflected by the optical disk passes through the second holographic element;

wherein the light receiving element is arranged so as to be located between a couple of the focal positions of the 0th order diffracted light of the first and second holographic elements and a couple of the first and second light sources on a virtual plane perpendicular to an optical axis of the light beam L1 or light beam L2 emitted toward the optical disk from the first or second light source onto which plane the light receiving element is projected, and wherein the first light source, the second light source, the wavelength separating element, the first holographic element, and the second holographic element are formed integrally into a single component; and an optical system for guiding light emitted from the holographic laser to an optical disk and guiding light reflected from the optical disk to the holographic laser.

21. An optical laser pickup comprising:

a holographic laser comprising:

a first light source for emitting a light beam L1 of a first wavelength toward an optical disk;

a second light source for emitting a light beam L2 of a second wavelength different from the first wavelength toward an optical disk, the second light source being positioned near the first light source;

first and second wavelength separating elements for respectively separating the light beam L1 and the light beam L2 reflected by the respective optical disks;

a first holographic element for converging the light beam L1 separated by the first wavelength separating element;

a second holographic element for converging the light beam L2 separated by the second wavelength separating element; and a light receiving element for receiving the light beam L1 converged by the first holographic element and the light beam L2 converged by the second holographic element;

wherein the first holographic element, the first wavelength separating element, the second holographic element, and the second wavelength separating element are arranged in this order in a direction in which the light beam L1 and the light beam L2 are emitted from the first and second light sources toward the respective optical disks;

wherein the first holographic element is arranged at a position so that the light beam L1 of the first wavelength emitted from the first light source toward the optical disk does not pass through the first holographic element, and the light beam L1 of the first wavelength reflected by the optical disk passes through the first holographic element;

wherein the second holographic element is arranged at a position so that the light beam L2 of the second wavelength emitted from the second light source toward the optical disk does not pass through the second holographic element, and the light beam L2 reflected by the optical disk passes through the second light holographic element;

wherein the light receiving element is positioned between a focal position of 0th order diffracted light of the first holographic element and a focal position of 0th order diffracted light of the second holographic element; and wherein the first light source, the second light source, the first wavelength separating element, the second wavelength separating element, the first holographic element, and the second holographic element are formed integrally into a single component; and an optical system for guiding light emitted from the holographic laser to an optical disk and guiding light reflected from the optical disk to the holographic laser.

* * * * *